(12) United States Patent
Mizuno et al.

(10) Patent No.: US 7,205,795 B2
(45) Date of Patent: Apr. 17, 2007

(54) SEMICONDUCTOR DEVICE HAVING UNIVERSAL LOGIC CELL

(75) Inventors: Masaharu Mizuno, Kanagawa (JP); Kazuhiro Nakajima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 195 days.

(21) Appl. No.: 11/092,943

(22) Filed: Mar. 30, 2005

(65) Prior Publication Data

US 2005/0218936 A1 Oct. 6, 2005

(30) Foreign Application Priority Data

Mar. 31, 2004 (JP) .............................. 2004/106892

(51) Int. Cl.
*H03K 19/20* (2006.01)
(52) U.S. Cl. ...................................... 326/113; 326/112
(58) Field of Classification Search .................. 326/81, 326/112–113, 119, 121, 122
See application file for complete search history.

(56) References Cited

U.S. PATENT DOCUMENTS 5,973,507 A * 10/1999 Yamazaki .................... 326/52
6,462,582 B1 * 10/2002 Forbes ......................... 326/98
7,061,275 B2 * 6/2006 Wang .......................... 326/113

FOREIGN PATENT DOCUMENTS

JP 2002-198801 7/2002

* cited by examiner

*Primary Examiner*—James H. Cho
(74) *Attorney, Agent, or Firm*—McGinn IP Law Group, PLLC

(57) ABSTRACT

A universal logic module includes: a first inverter outputting an inverted input signal to an output terminal through a first transfer gate, the inverted input signal having an inverted level of an input signal provided from a first input terminal; and a second inverter outputting an inverted logic signal to the output terminal through a second transfer gate, the inverted logic signal having an inverted level of a first logic signal. The first input terminal is connected to one of a power supply line and a ground line. An input of the first transfer gate is directly connected to the other of the power supply line and the ground line. The first and the second transfer gates are complementarily turned on/off according to a level of a second logic signal. A result of a logical operation between the first and the second logic signals is outputted from the output terminal.

15 Claims, 19 Drawing Sheets

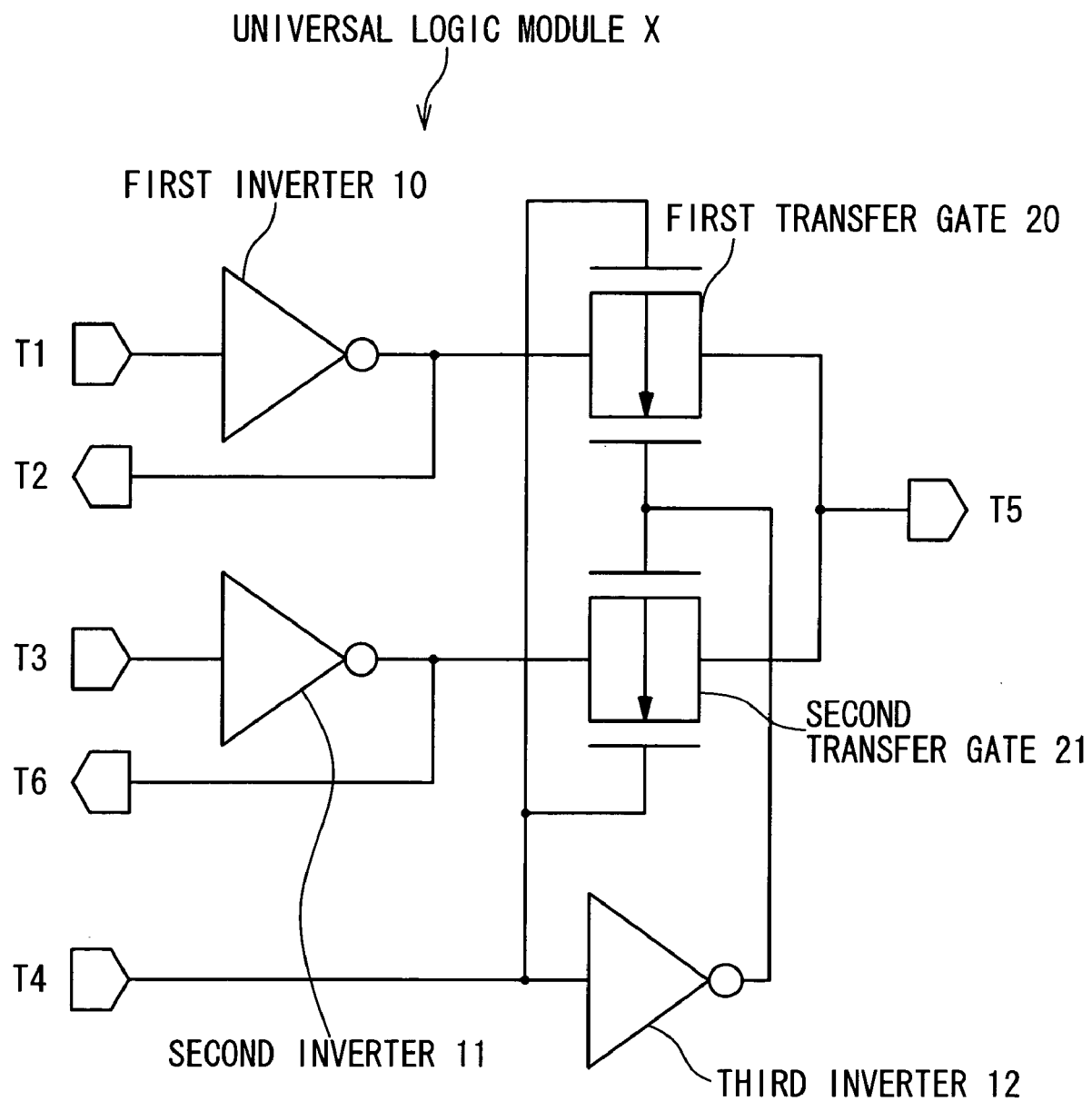

SEMICONDUCTOR DEVICE HAVING UNIVERSAL LOGIC CELL

BACKGROUND OF THE INVENTION

1. Field of the Invention

The present invention relates to a semiconductor device. More particularly, the present invention relates to a semiconductor device provided with a universal logic cell (ULC), and a method of manufacturing the semiconductor device.

2. Description of the Related Art

A semiconductor device using a universal logic cell (ULC) and capable of switching at a high speed has been developed.

A "semi-custom technique" is known as a method of designing and manufacturing a semiconductor device by using a universal logic cell and a universal logic module. The semi-custom technique includes a "master slice method".

According to the master slice method, for example, a universal logic module is formed beforehand in a master slice (base layer), which is known as a structured ASIC (Application Specific Integrated Circuit). The universal logic module is configured to be able to provide a logic gate such as a NAND circuit and a NOR circuit. Also, the universal logic modules are arranged in a matrix form on a chip.

According to the master slice method, a variety of universal logic modules are formed beforehand on a chip as a master slice (base layer). A power supply interconnection and a ground interconnection which are connected with transistors included in the universal logic modules are previously formed in a wiring layer of the base layer. In the wiring process, interconnections are formed in a customize layer on the master slice in accordance with the customer's requirement. As a result, a desired integrated circuit is realized and obtained.

Since the master slice is used in common and only the interconnections in the customize layer are customized, it is possible to manufacture a large variety of integrated circuits for a short period and at low cost. Also, a large variety of logic circuits can be manufactured by combining a plurality of kinds of universal logic modules.

Japanese Unexamined Patent Publication JP-2002-198801 discloses such a universal logic module capable of switching at a high speed as described above and a cell using the universal logic module.

FIG. 1 shows a configuration of a cell according to the conventional technique. The cell includes a first universal logic module X, a second universal logic module Y, and a third universal logic module Z. Shown in FIG. 1 is a case where two first universal logic modules X, two second universal logic modules Y, and one third universal logic module Z are used. The number of each universal logic module is arbitrary. It is preferable that a cell includes the first universal logic module X, the second universal logic module Y and the third universal logic module Z at a ratio of 2:2:1.

FIG. 2 is a circuit diagram showing a configuration of the first universal logic module X as a component of the cell according to the above-mentioned conventional invention. The universal logic module is constituted by an inverted output type two-input multiplexer of which the first stage consists of inverters and the second stage consists of transfer gates. The universal logic module includes six nodes (a first node T1, a second node T2, a third node T3, a fourth node T4, a fifth node T5, and a sixth node T6), and five logic elements (a first inverter 10, a second inverter 11, a third inverter 12, a first transfer gate 20, and a second transfer gate 21).

For example, each of the first to the third inverters 10 to 12 has a well-known configuration where an N-channel MOS transistor and a P-channel MOS transistor are serially connected between a power supply and a ground (CMOS inverter). Each inverter inverts an inputted signal and outputs the inverted signal.

Each of the first and the second transfer gates (transmission gates) 20 and 21 has a configuration wherein an N-channel MOS transistor and a P-channel MOS transistor are connected in parallel. Each of the transfer gates transmits a signal supplied to an input terminal or prevents the passage of the signal supplied to the input terminal according to signals supplied to a gate of the N-channel MOS transistor and a gate of the P-channel MOS transistor. Hereinafter, the gate of the P-channel MOS transistor in the transfer gate is called a first control input terminal, and the gate of the N-channel MOS transistor in the transfer gate is called a second control input terminal.

The first node T1 is connected to an input terminal of the first inverter 10. An output terminal of the first inverter 10 is connected to the input terminal of the first transfer gate 20 and the second node T2.

The third node T3 is connected to an input terminal of the second inverter 11. An output terminal of the second inverter 11 is connected to the input terminal of the second transfer gate 21 and the sixth node T6.

The fourth node T4 is connected to an input terminal of the third inverter 12, the first control input terminal of the first transfer gate 20, and the second control input terminal of the second transfer gate 21. An output terminal of the third inverter 12 is connected to the second control input terminal of the first transfer gate 20, and the first control input terminal of the second transfer gate 21.

An output terminal of the first transfer gate 20 and an output terminal of the second transfer gate 21 are connected to the fifth node T5.

A basic operation of the universal logic module configured as described above will be explained. When a signal of a low level (hereinafter, to be referred to as "L level") is inputted to the fourth node T4, both the P-channel MOS transistor and the N-channel MOS transistor in the first transfer gate 20 are turned ON, and both the P-channel MOS transistor and the N-channel MOS transistor in the second transfer gate 21 are turned OFF. As a result, a signal inputted from the first node T1 is inverted by the first inverter 10, and is outputted from the fifth node T5 through the first transfer gate 20.

On the other hand, when a signal of a high level (hereinafter, to be referred to as "H level") is inputted to the fourth node T4, both the P-channel MOS transistor and the N-channel MOS transistor in the first transfer gate 20 are turned OFF, and both the P-channel MOS transistor and the N-channel MOS transistor in the second transfer gate 21 are turned ON. As a result, a signal inputted from the third node T3 is inverted by the second inverter 11, and is outputted from the fifth node T5 through the second transfer gate 21.

As described above, either the signal inputted into the first node T1 or the signal inputted into the third node T3 is inverted and outputted from the fifth node T5 according to the level of the signal supplied to the fourth node T4. In other words, a function of an "inverted output type multiplexer" is realized.

Next, a "NAND" circuit and a "NOR" circuit realized (provided) by the above-mentioned universal logic module will be explained.

FIG. 3A is a circuit diagram showing a configuration of a NAND circuit provided by using the universal logic module shown in FIG. 2.

As shown in FIG. 3A, the first node T1 of the universal logic module shown in FIG. 2 is connected to an L level (logic "0"), and the second node T2 and the sixth node T6 are not connected (denoted by NC). Also, the third node T3 and the fourth node T4 are used as input terminals (A, B), and the fifth node T5 is used as an output terminal (O). Thus, a two-input NAND circuit is realized. FIG. 3B is a connection diagram at the time of actually operating the NAND circuit shown in FIG. 3A. The first node T1 is connected to a ground line 7 so that the first node T1 is set to the L level (logic "0").

According to the NAND circuit of the conventional technique, when the first transfer gate 20 is opened and the H level signal is driven from the fifth node T5, the driving capability is limited due to an ON resistance of the P-channel transistor in the first inverter 10.

It should be noted that the basic universal logic module (X) is formed in the base layer. A ground line 7 connected to the first node, and signal input lines connected to the nodes T3 and T4 are respectively formed in the customize layer, and are electrically connected to the corresponding node. The circuits shown in FIGS. 3A and 3B are described by a symbol of a "NAND" type (CMOS) shown in FIG. 3C.

FIG. 4A is a circuit diagram showing a configuration of a NOR circuit provided by using the universal logic module shown in FIG. 2.

As shown in FIG. 4A, the third node T3 of the universal logic module shown in FIG. 2 is connected to an H level (logic "1"), and the second node T2 and the sixth node T6 are not connected. Also, the first node T1 and the fourth node T4 are used as input terminals (A, B), and the fifth node T5 is used as an output terminal (O). Thus, a two-input NOR circuit is realized. FIG. 4B is a connection diagram at the time of actually operating the NOR circuit shown in FIG. 4A. The third node T3 is clamped to a power supply line 8 so that the third node T3 is set to the H level (logic "1").

According to the NOR circuit of the conventional technique, when the second transfer gate 21 is opened and the L level signal is driven from the fifth node T5, the driving capability is limited due to an ON resistance of the N-channel transistor in the second inverter 11.

It should be noted that the basic universal logic module (X) is formed in the base layer. A power supply line 8 connected to the third node, and signal input lines connected to the nodes T1 and T4 are respectively formed in the customize layer, and are electrically connected to the corresponding node. The circuits shown in FIGS. 4A and 4B are described by a symbol of a "NOR" type (CMOS) shown in FIG. 4C.

According to the conventional technique, as described above, since the input of the inverter is connected to the power supply or the ground, the output driving capability of the universal logic module is limited due to the ON resistance of the P-channel transistor or the N-channel transistor in the inverter.

SUMMARY OF THE INVENTION

It is an object of the present invention to provide a semiconductor device and a method of manufacturing the same which can enhance the output driving capability and hence increase the switching speed.

It is another object of the present invention to provide a semiconductor device and a method of manufacturing the same which can prevent the electrostatic destruction and reduce the leak current.

It is still another object of the present invention to provide a semiconductor device and a method of manufacturing the same which can improve the reliability.

In an aspect of the present invention, a semiconductor device has a power supply line, a ground line, and a universal logic module. The universal logic module includes a first inverter and a second inverter. The first inverter is configured to output an inverted input signal to an output terminal through a first transfer gate, the inverted input signal having an inverted level of an input signal provided from a first input terminal. The second inverter is configured to output an inverted logic signal to the output terminal through a second transfer gate, the inverted logic signal having an inverted level of a first logic signal. The first input terminal is connected to one of the power supply line and the ground line. An input of the first transfer gate is directly connected to the other of the power supply line and the ground line. The first transfer gate and the second transfer gate are complementarily turned on and off according to a level of a second logic signal. A result of a logical operation between the first logic signal and the second logic signal is outputted from the output terminal.

The universal logic module further includes a third inverter inputting the second logic signal. The first transfer gate and the second transfer gate are complementarily turned on and off according to a level of the second logic signal and an output level of the third inverter.

Each of the first transfer gate and the second transfer gate includes: a P-channel transistor; a N-channel transistor; a first control input terminal connected to a gate of the P-channel transistor; and a second control input terminal connected to a gate of the N-channel transistor.

In the semiconductor device, the first input terminal is connected to a first node. The input of the first transfer gate is connected to a second node. The first logic signal is inputted to a third node. The second logic signal is inputted to a fourth node. The output terminal is connected to a fifth node. An input of the second transfer gate is connected to a sixth node. The first transfer gate is configured such that the input thereof is connected to an output of the first inverter, the first control input terminal thereof is connected to the fourth node, and the second control input terminal thereof is connected to an output of the third inverter. The second transfer gate is configured such that the input thereof is connected to an output of the second inverter, the first control input terminal thereof is connected to an output of the third inverter, and the second control input terminal thereof is connected to the fourth node. The first node is connected to the ground line, and the second node is connected to the power supply line. As a result, a "NAND" circuit is provided.

In the semiconductor device, the first input terminal is connected to a first node. The first logic signal is inputted to a third node. The second logic signal is inputted to a fourth node. The output terminal is connected to a fifth node. The first inverter includes: a first P-channel transistor whose source, gate and drain are connected to the power supply line, the first node and a second A-node, respectively; a first N-channel transistor whose source and gate are connected to the ground line and the first node, respectively; and the first transfer gate. The first transfer gate is configured such that a source of the P-channel transistor thereof is connected to the drain of the first P-channel transistor, a source of the N-channel transistor thereof is connected to a drain of the first N-channel transistor, the first control input terminal thereof is connected to the fourth node, and the second control input terminal thereof is connected to an output of the third inverter. The second inverter includes: a second P-channel transistor whose source and gate are connected to the power supply line and the third node, respectively; a second N-channel transistor whose source and gate are connected to the ground line and the third node, respectively; and the second transfer gate. The second transfer gate is configured such that a source of the P-channel transistor thereof is connected to a drain of the second P-channel transistor, a source of the N-channel transistor thereof is connected to a drain of the second N-channel transistor, the first control input terminal thereof is connected to an output of the third inverter, and the second control input terminal thereof is connected to the fourth node. The first node is connected to the ground line, and the second A-node is connected to the power supply line. As a result, a "NAND" circuit is provided.

In the semiconductor device, the first input terminal is connected to a first node. An output of the first inverter is connected to a second node. The first logic signal is inputted to a third node. The second logic signal is inputted to a fourth node. The output terminal is connected to a fifth node. An output of the second inverter is connected to a sixth node. The first transfer gate is configured such that a source of the P-channel transistor thereof is connected to a second A-node, a source of the N-channel transistor thereof is connected to a second B-node, the first control input terminal thereof is connected to the fourth node, and the second control input terminal thereof is connected to an output of the third inverter. The second transfer gate is configured such that a source of the P-channel transistor thereof is connected to a sixth A-node, a source of the N-channel transistor thereof is connected to a sixth B-node, the first control input terminal thereof is connected to an output of the third inverter, and the second control input terminal thereof is connected to the fourth node. The sixth A-node and the sixth B-node are connected to the sixth node. The second B-node is connected to the second node. The first node is connected to the ground line, and the second A-node is connected to the power supply line. As a result, a "NAND" circuit is provided.

In the semiconductor device, the first input terminal is connected to a third node. The input of the first transfer gate is connected to a sixth node. The first logic signal is inputted to a first node. The second logic signal is inputted to a fourth node. The output terminal is connected to a fifth node. An input of the second transfer gate is connected to a second node. The first transfer gate is configured such that the input thereof is connected to an output of the first inverter, the first control input terminal thereof is connected to an output of the third inverter, and the second control input terminal thereof is connected to the fourth node. The second transfer gate is configured such that the input thereof is connected to an output of the second inverter, the first control input terminal thereof is connected to the fourth node, and the second control input terminal thereof is connected to an output of the third inverter. The third node is connected to the power supply line, and the sixth node is connected to the ground line. As a result, a "NOR" circuit is provided.

In the semiconductor device, the first input terminal is connected to a third node. The first logic signal is inputted to a first node. The second logic signal is inputted to a fourth node. The output terminal is connected to a fifth node. The first inverter includes: a first P-channel transistor whose source and gate are connected to the power supply line and the third node, respectively; a first N-channel transistor whose source, gate and drain are connected to the ground line, the third node and a sixth B-node, respectively; and the first transfer gate. The first transfer gate is configured such that a source of the P-channel transistor thereof is connected to a drain of the first P-channel transistor, a source of the N-channel transistor thereof is connected to the drain of the first N-channel transistor, the first control input terminal thereof is connected to an output of the third inverter, and the second control input terminal thereof is connected to the fourth node. The second inverter includes: a second P-channel transistor whose source and gate are connected to the power supply line and the first node, respectively; a second N-channel transistor whose source and gate are connected to the ground line and the first node, respectively; and the second transfer gate. The second transfer gate is configured such that a source of the P-channel transistor thereof is connected to a drain of the second P-channel transistor, a source of the N-channel transistor thereof is connected to a drain of the second N-channel transistor, the first control input terminal thereof is connected to the fourth node, and the second control input terminal thereof is connected to an output of the third inverter. The third node is connected to the power supply line, and the sixth B-node is connected to the ground line. As a result, a "NOR" circuit is provided.

In the semiconductor device, the first input terminal is connected to a third node. An output of the first inverter is connected to a sixth node. The first logic signal is inputted to a first node. The second logic signal is inputted to a fourth node. The output terminal is connected to a fifth node. An output of the second inverter is connected to a second node. The first transfer gate is configured such that a source of the P-channel transistor thereof is connected to a sixth A-node, a source of the N-channel transistor thereof is connected to a sixth B-node, the first control input terminal thereof is connected to an output of the third inverter, and the second control input terminal thereof is connected to the fourth node. The second transfer gate is configured such that a source of the P-channel transistor thereof is connected to a second A-node, a source of the N-channel transistor thereof is connected to a second B-node, the first control input terminal thereof is connected to the fourth node, and the second control input terminal thereof is connected to an output of the third inverter. The second A-node and the second B-node are connected to the second node. The sixth A-node is connected to the sixth node. The third node is connected to the power supply line, and the sixth B-node is connected to the ground line. As a result, a "NOR" circuit is provided.

In the semiconductor device, the above-mentioned nodes such as the first node, the second node, the second A-node, the second B-node, the third node, the fourth node, the fifth node, the sixth node, the sixth A-node and the sixth B-node are formed in a master slice. In this case, interconnections connected to the nodes, the power supply line and the ground line are formed in a customize layer provided on the master slice.

A method of manufacturing a semiconductor device according to the present invention includes: (a) providing a master slice in which the above-mentioned universal logic module is formed; and (b) forming interconnections in a customize layer on the master slice. The interconnections are connected to the nodes, the power supply line and the ground line.

According to the semiconductor device of present invention, a universal logic module of two input inversion type is used, in which the inverters are provided in the first stage, the transfer gates are provided in the second stage, and middle nodes are exposed on the base layer and can be connected by using interconnections formed in the customize layer. A predetermined node is clamped according to a logic gate to be formed. As a result, it is possible to improve (enhance) the output driving capability and hence to increase the switching speed and the operation speed of an integrated circuit.

Also, according to the present invention, the source electrodes or the drain electrodes of the N-channel transistor and the P-channel transistor in the transfer gate may be separated and disconnected. Therefore, even if some middle nodes are clamped so as to enhance the output driving capability, the power supply potential is not directly applied to the side of the N-channel transistor of the transfer gate. Thus, the transistor destruction caused by the electrostatic destruction can be prevented, and the leak current can be reduced. It is therefore possible to improve the reliability of the semiconductor device.

BRIEF DESCRIPTION OF THE DRAWINGS

FIG. 2 is a circuit diagram showing a configuration of a first universal logic module according to the conventional technique;

DESCRIPTION OF THE PREFERRED EMBODIMENTS

The preferred embodiments of a semiconductor device provided with a universal logic module according to the present invention will be described below with reference to the accompanying drawings.

The universal logic module according to the embodiments of the present invention is of a two-inputs inversion type, in which inverters are provided in a first stage and transfer gates are provided in a second stage, as described below. The universal logic module is configured to have a function of a multiplexer by connecting the inverters and the transfer gates connected in series. Also, according to the universal logic module, outputs of the inverters can be used as nodes (middle nodes).

Figure 5:
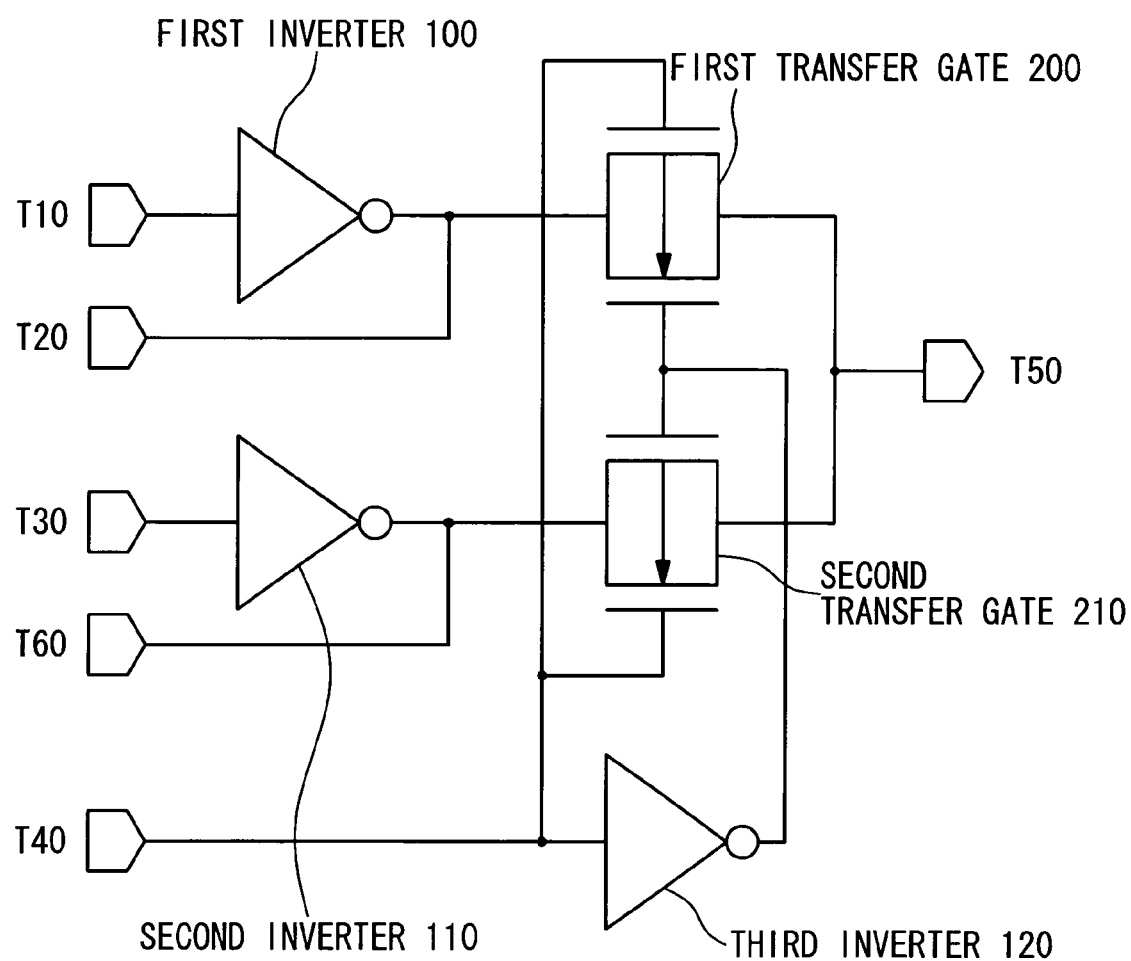
FIG. 5 is a circuit diagram showing a configuration of a universal logic module according to embodiments of the present invention.

FIG. 5 is a circuit diagram showing a configuration of a universal logic module according to the present invention. The universal logic module is configured to be a two-inputs multiplexer of an inverted output type, in which inverters are provided at the first stage and transfer gates are provided at the second stage. The universal logic module has six nodes (a first node T10, a second node T20, a third node T30, a fourth node T40, a fifth node T50, and a sixth node T60), and five logic elements (an inverter 100, an inverter 110, an inverter 120, a transfer gate 200, and a transfer gate 210).

Each of the inverters 100, 110, and 120 has a well-known configuration where a N-channel MOS transistor (maybe referred to as a Nch transistor) and a P-channel MOS transistor (maybe referred to as a Pch transistor) are serially connected between a power supply and a ground. Each of the inverters (CMOS inverters) 100, 110, and 120 inverts an inputted signal and outputs the inverted signal. The inverters 100, 110 and 120 are made small in size so as to reduce input capacitance.

Each of the transfer gates 200 and 210 has a configuration wherein an N-channel MOS transistor (maybe referred to as a Nch transistor) and a P-channel MOS transistor (maybe referred to as a Pch transistor) are connected in parallel. Sources of the Pch transistor and the Nch transistor in the transfer gate are connected with each other, and drains of the Pch transistor and the Nch transistor in the transfer gate are connected with each other. Each of the transfer gates 200 and 210 transmits a signal supplied to the input or prevents the passage of the signal supplied to the input according to signals supplied to a gate of the Nch transistor and a gate of the Pch transistor. Hereinafter, the gate of the Pch transistor of each transfer gate is called a "first control input terminal", and the gate of the Nch transistor of each transfer gate is called a "second control input terminal".

The first node T10 is connected to an input of the inverter 100. An output of the inverter 100 is connected to an input of the transfer gate 200 and the second node T20.

The third node T30 is connected to an input of the inverter 110. An output of the inverter 110 is connected to an input of the transfer gate 210 and the sixth node T60.

The fourth node T40 is connected to an input of the inverter 120, the first control input terminal of the transfer gate 200, and the second control input terminal of the transfer gate 210. An output of the inverter 120 is connected to the second control input terminal of the transfer gate 200, and the first control input terminal of the transfer gate 210.

An output of the transfer gate 200 and an output of the transfer gate 210 are connected to the fifth node T50.

An operation of the universal logic module configured as described above will be explained. The universal logic module basically functions as a multiplexer. That is, when a signal of a low level (hereinafter, to be referred to as "L level") is inputted to the fourth node T40, both the P-channel MOS transistor and the N-channel MOS transistor in the transfer gate 200 are turned ON, and both the P-channel MOS transistor and the N-channel MOS transistor in the transfer gate 210 are turned OFF. As a result, a signal inputted from the first node T10 is inverted by the first inverter 100, and is outputted from the fifth node T50 through the first transfer gate 200.

On the other hand, when a signal of a high level (hereinafter, to be referred to as "H level") is inputted to the fourth node T40, both the P-channel MOS transistor and the N-channel MOS transistor in the transfer gate 200 are turned OFF, and both the P-channel MOS transistor and the N-channel MOS transistor in the transfer gate 210 are turned ON. As a result, a signal inputted from the third node T30 is inverted by the second inverter 110, and is outputted from the fifth node T50 through the second transfer gate 210.

As described above, either the signal inputted into the first node T10 or the signal inputted into the third node T30 is inverted, and is outputted from the fifth node T50 according to the level of the signal supplied to the fourth node T40. Thus, a function of an inverted output type multiplexer is realized by the above operation.

Furthermore, a "NAND" circuit and a "NOR" circuit can be realized by using the universal logic module according to the present invention, as will be described below. In this case, one of the inverters 100 and 110 will be used as a "first inverter", and the other will be used as a "second inverter". Also, one of the transfer gates 200 and 210 will be used as a "first transfer gate", and the other will be used as a "second transfer gate".

As described below, the first inverter outputs an inverted input signal to an output terminal of the semiconductor device through the first transfer gate. Here, the inverted input signal has an inverted level of an input signal provided from a "first input terminal". For example, the inverter 100 is the first inverter, and the transfer gate 200 is the first transfer gate, as shown in FIG. 5. In this case, the first input terminal can be connected to the node T10. Also, the second inverter outputs an inverted logic signal to the output terminal of the semiconductor device through the second transfer gate. Here, the inverted logic signal has an inverted level of a "first logic signal". For example, the inverter 110 is the second inverter, and the transfer gate 210 is the second transfer gate, as shown in FIG. 5. In this case, the first logic signal can be inputted to the third node T30. It should be noted that the output terminal of the semiconductor device is connected to the fifth node T50.

Also, the inverter 120 is used as a "third inverter". The third inverter inputs a "second logic signal" which is supplied from the fourth node T40. The first transfer gate and the second transfer gate are complementarily turned on and off according to the level of the second logic signal and the output level of the third inverter.

It should be also noted that the semiconductor device having the universal logic module according to the embodiment of the present invention is manufactured according to a master slice technique. That is to say, the transistors in the inverters and the transfer gates, and fundamental interconnections for connecting them electrically are formed beforehand in a base layer (master slice). The nodes are formed to be exposed on the base layer. Electrical interconnections are formed in a customize layer on the base layer to connect between the nodes in the base layer according to a request from a customer. In other words, the master slice (base layer) in which the universal logic modules are previously formed is provided, and then the interconnections connecting with the nodes are formed in the customize layer to manufacture a module having a desired function.

First Embodiment

Figure 6A:
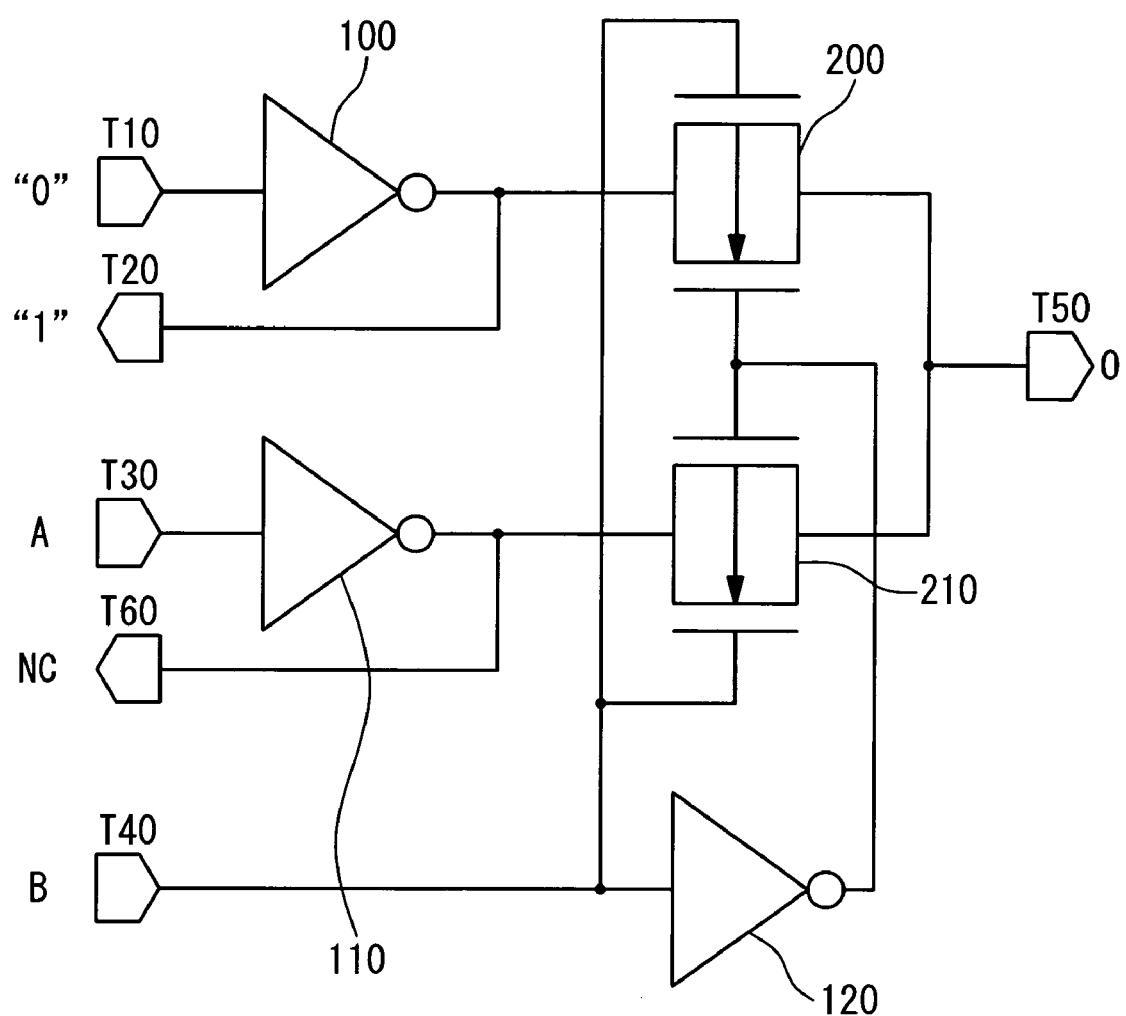
FIG. 6A is a circuit diagram showing a configuration of a NAND circuit achieved by using the universal logic module shown in FIG. 5 according to a first embodiment of the present invention.

According to a first embodiment of the present invention, a "NAND" circuit is provided by using the universal logic module. FIG. 6A is a circuit diagram showing a configuration of the NAND circuit achieved by using the universal logic module shown in FIG. 5 according to the present embodiment.

In the present embodiment, the inverter 100 is used as the "first inverter", and the transfer gate 200 is used as the "first transfer gate". Thus, the above-mentioned first input terminal is connected to the first node T10, and the input of the first transfer gate 200 is connected to the second node T20. On the other hand, the inverter 110 is used as the "second inverter", and the transfer gate 210 is used as the "second transfer gate".

As shown in FIG. 6A, the first node T10 of the universal logic module shown in FIG. 5 is connected to the first input terminal, and is connected to an L level (logic "0"), and the second node T20 is connected to an H level (logic "1"). The sixth node T60 is not connected (denoted by NC). The third node T30 and the fourth node T40 are used as input terminals (A, B). In other words, the first logic signal (A) is inputted to the third node T30, and the second logic signal (B) is inputted to the fourth node T40. The fifth node T50 is used as an output terminal (O). As a result, a two-inputs NAND circuit is realized.

According to the NAND circuit shown in FIG. 6A, the driving current is supplied not only from the inverter 100 connected to the node T10 to which the logic "0" is inputted but also from the node T20 to which the logic "1" is inputted. That is, the driving current is supplied directly from the power supply. As a result, it is possible to improve (enhance) the output driving capability. Thus, the charging time of a circuit driven by the universal logic module according to the present embodiment can be reduced. It is therefore possible to increase the switching speed and the operation speed.

Figure 6B:
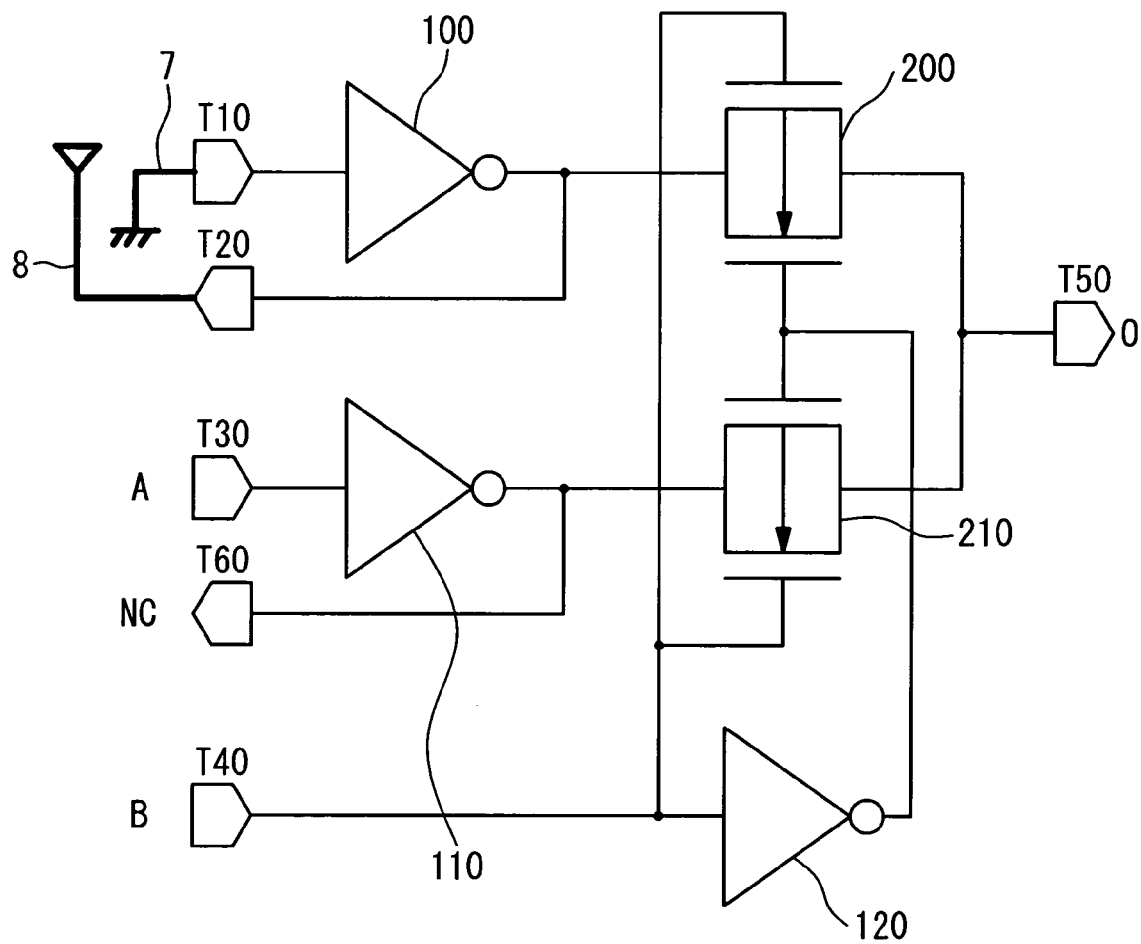
FIG. 6B is a connection diagram at the time of actually operating the NAND circuit shown in FIG. 6A.
Figure 6C:
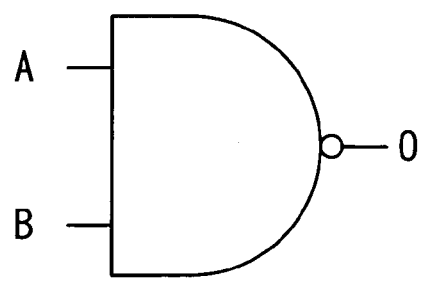
FIG. 6C shows a symbol describing the NAND circuit.

FIG. 6B is a connection diagram at the time of actually operating the NAND circuit shown in FIG. 6A. As shown in FIG. 6B, the first node T10 is connected to a ground line 7 such that the first node T10 is set to the L level. Also, the second node T20 is connected to a power supply line 8 such that the second node T20 is set to the H level. It should be noted that the circuits shown in FIGS. 6A and 6B are described as a symbol of a "NAND" type (CMOS) shown in FIG. 6C.

Second Embodiment

In a second embodiment of the present invention, a "NAND" circuit is also provided by using a universal logic module.

Figure 7:
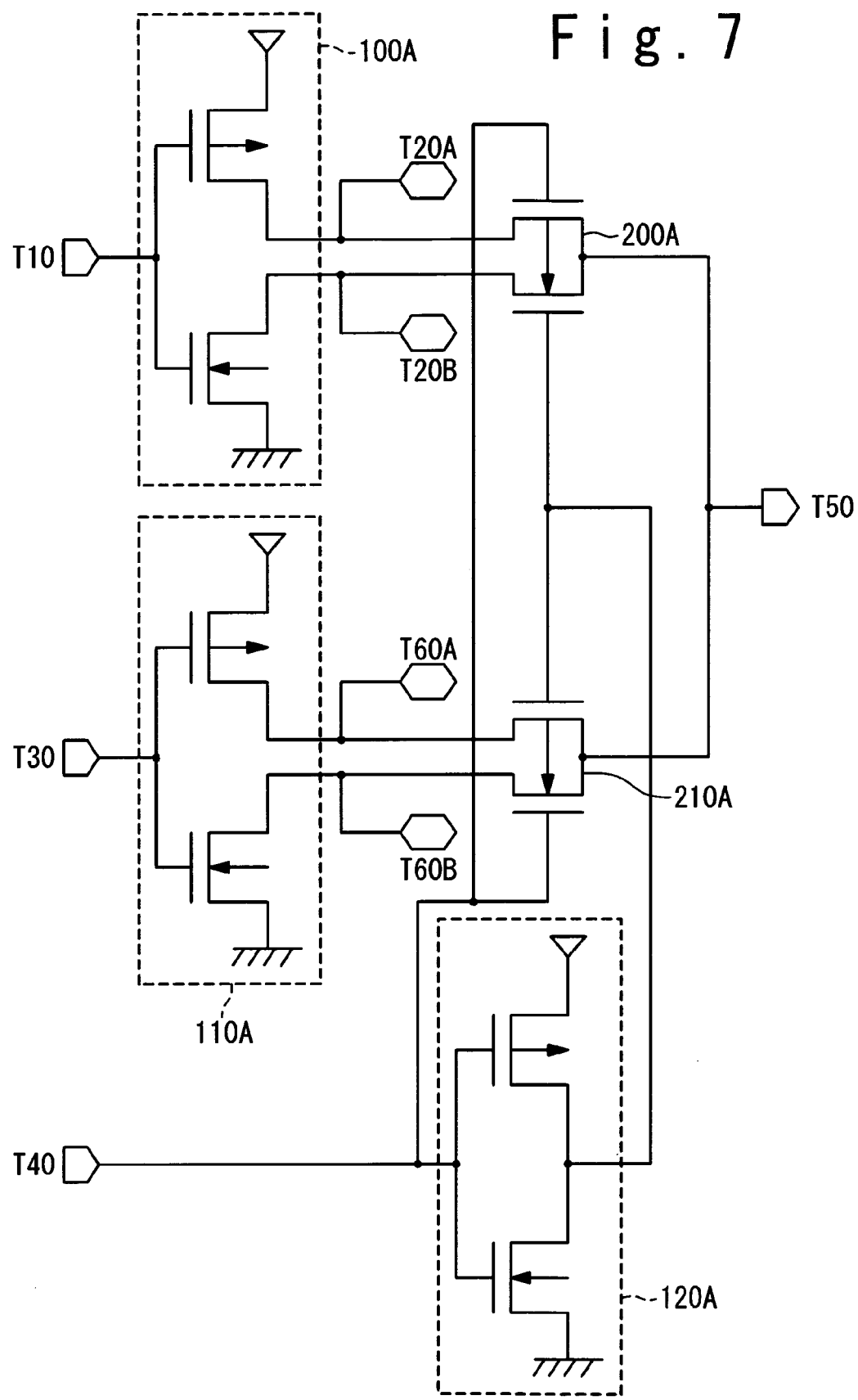
FIG. 7 is a circuit diagram showing a configuration of a universal logic module according to a second embodiment of the present invention.

FIG. 7 is a circuit diagram showing a configuration of the universal logic module according to the second embodiment of the present invention. Though a basic configuration and a basic operation of the universal logic module in the present embodiment are similar to those in the first embodiment, the output terminals of the inverters, and the input terminals of the transfer gates are different from those in the first embodiment, as described below.

According to the present embodiment, as shown in FIG. 7, an inverter 100A is formed to have separate outputs; an output from a drain of the Nch transistor and an output from a drain of the Pch transistor. Also, an inverter 110A is formed to have separate outputs; an output from a drain electrode of the Nch transistor and an output from a drain electrode of the Pch transistor. A transfer gate 200A is formed to have separate inputs; an input from a source/drain of the Pch transistor and an input from a source/drain of the Nch transistor. Also, a transfer gate 210A is formed to have separate inputs; an input from a source/drain of the Pch transistor and an input from a source/drain of the Nch transistor.

More specifically, the universal logic module of the present embodiment has a first node T10, a second A-node T20A, a second B-node T20B, a third node T30, a fourth node T40, a fifth node T50, a sixth A-node T60A, and a sixth B-node T60B. The inverter 100A includes a first Pch transistor and a first Nch transistor. A source, a gate and a drain of the first Pch transistor are connected to the power supply, the first node T10 and the second A-node T20A, respectively. A source, a gate and a drain of the first Nch transistor are connected to the ground, the first node T10 and the second B-node T20B, respectively. Also, the inverter 110A includes a second Pch transistor and a second Nch transistor. A source, a gate and a drain of the second Pch transistor are connected to the power supply, the third node T30 and the sixth A-node T60A, respectively. A source, a gate and a drain of the second Nch transistor are connected to the ground, the third node T30 and the sixth B-node T60B, respectively. An input of a third inverter 120A is connected to the fourth node T40.

With regard to the transfer gate 200A, the source/drain (input) of the Pch transistor is connected to the drain of the first Pch transistor of the inverter 100A and the second A-node T20A. The source/drain (input) of the Nch transistor is connected to the drain of the first Nch transistor of the inverter 100A and the second B-node T20B. The first control input terminal is connected to the fourth node T40, and the second control input terminal is connected to the output of the third inverter 120A.

With regard to the transfer gate 210A, the source/drain (input) of the Pch transistor is connected to the drain of the second Pch transistor of the inverter 110A and the sixth A-node T60A. The source/drain (input) of the Nch transistor is connected to the drain of the second Nch transistor of the inverter 110A and the sixth B-node T60B. The first control input terminal is connected to the output of the third inverter 120A, and the second control input terminal is connected to the fourth node T40.

The fifth node T50 is connected to the output of the transfer gate 200A, and the output of the transfer gate 210A.

In the present embodiment, the transfer gate 200A is used as the "first transfer gate", and the transfer gate 210A is used as the "second transfer gate". Also, the inverter 100A and the first transfer gate 200A function as the "first inverter", and the inverter 110A and the second transfer gate 210A function as the "second inverter". The above-mentioned first input terminal is connected to the first node T10.

Figure 8:
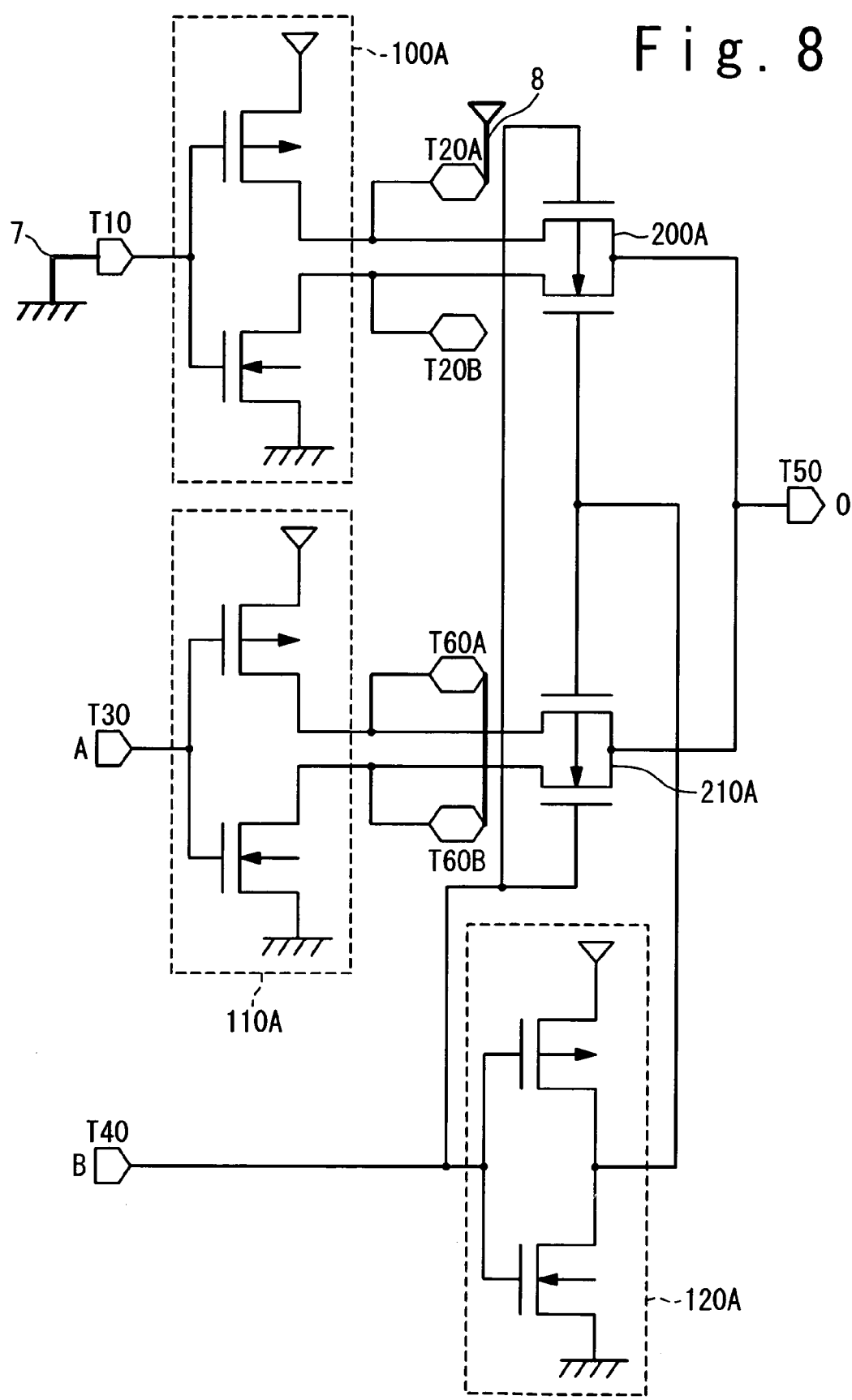
FIG. 8 is a connection diagram at the time of actually operating a NAND circuit achieved by using the universal logic module shown in FIG. 7 according to the second embodiment.

FIG. 8 is a connection diagram at the time of actually operating a "NAND" circuit achieved by using the universal logic module shown in FIG. 7 according to the second embodiment. As shown in FIG. 8, the first node T10 of the universal logic module shown in FIG. 7 is connected to a ground line 7 and is set to an L level (logic "0"). The second A-node T20A is connected to a power supply line 8 and is set to an H level (logic "1"). The second B-node T20B is not connected to any other element. The sixth A-node T60A is short-circuited to the sixth B-node T60B. Then, the third node T30 and the fourth node T40 are used as input terminals (A, B), and the fifth node T50 is used as an output terminal (O). In other words, the first logic signal (A) and the second logic signal (B) are respectively inputted into the third node T30 and the fourth node T40. The fifth node T50 outputs an output signal. As a result, a two-inputs NAND circuit is achieved. It should be noted that the sixth A-node T60A is not necessarily connected with the sixth B-node T60B.

According to the NAND circuit shown in FIG. 8, the second A-node T20A is directly clamped to the power supply, and thereby the driving current is directly inputted from the power supply into the transfer gate 200A without through the inverter 100A. In other words, the driving current is supplied not only from the inverter 100A connected to the node T10 to which the logic "0" is inputted but also from the second A-node T20A to which the logic "1" is inputted. As a result, it is possible to improve (enhance) the output driving capability. Thus, the delay time within the universal logic module according to the present embodiment can be reduced. Also, it is possible to reduce the charging time of a circuit connected to the output terminal (the fifth node T50) and driven by the universal logic module according to the present embodiment. It is therefore possible to increase the switching speed and the operation speed.

Moreover, the source/drain (input) of the Pch transistor in the first transfer gate 200A is separated from the source/drain (input) of the Nch transistor in the first transfer gate 200A. Therefore, even when the second A-node T20A is clamped to the power supply, the power supply potential is not directly applied to the Nch transistor of the first transfer gate 200A. Thus, the diffusion layer damage of the Nch transistor of the first transfer gate 200A caused by the electrostatic destruction can be prevented, and the leak current can be reduced. It is therefore possible to improve the reliability of the universal logic module (semiconductor device) as a whole.

At this time, from a viewpoint of the prevention of the electrostatic destruction as described above, the source diffusion layer of the first inverter 100A is arranged away from the source diffusion layer of the first transfer gate 200A by a distance.

Third Embodiment

In a third embodiment of the present invention, a "NAND" circuit is also provided by using a universal logic module.

Figure 9:
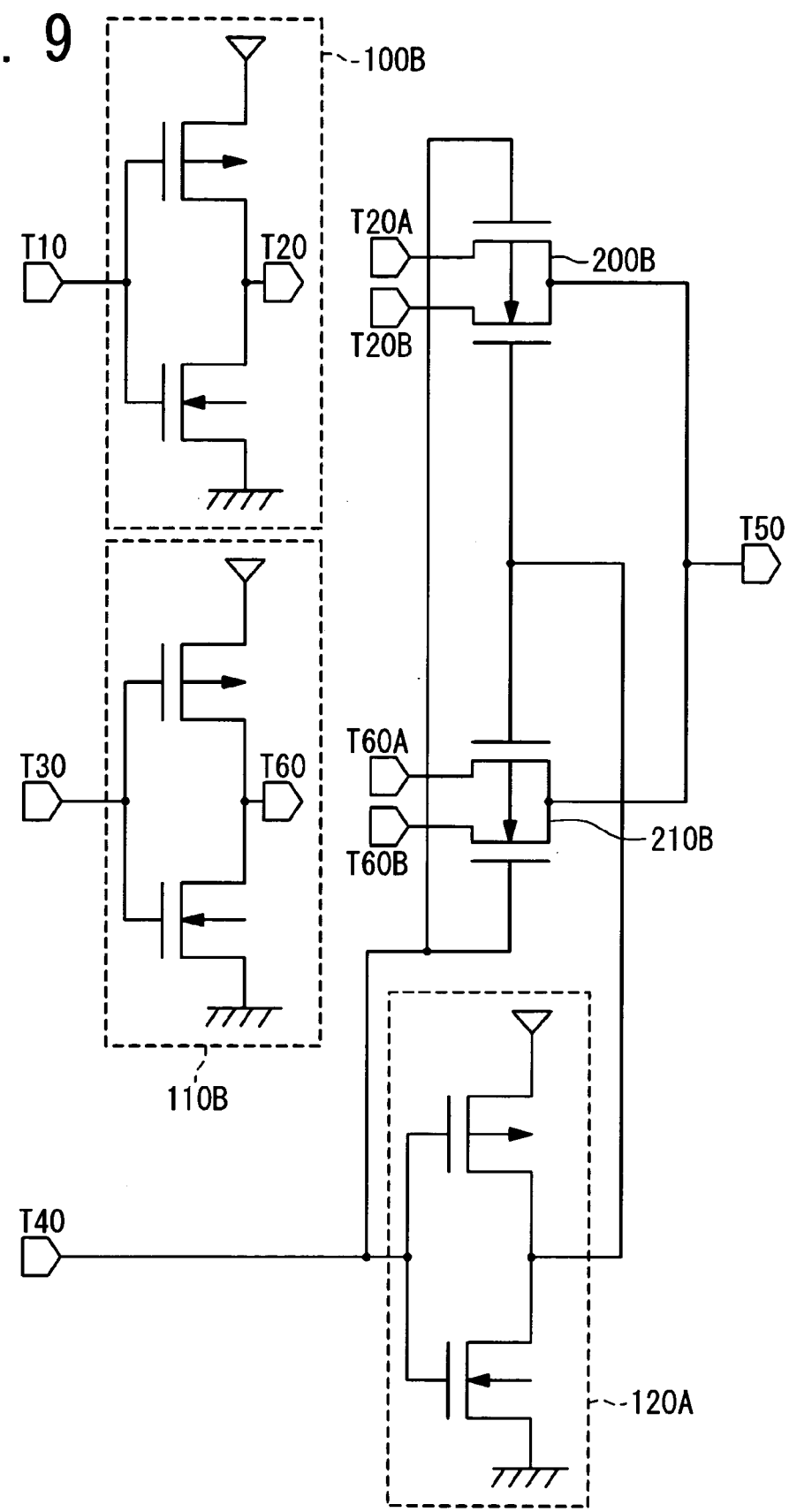
FIG. 9 is a circuit diagram showing a configuration of a universal logic module according to a third embodiment of the present invention.

FIG. 9 is a circuit diagram showing a configuration of the universal logic module according to the third embodiment of the present invention. Though a basic configuration and a basic operation of the universal logic module in the present embodiment are similar to those in the first embodiment, the input terminals of the transfer gates are different from those in the first embodiment, as described below.

According to the present embodiment, as shown in FIG. 9, a transfer gate 200B is formed to have separate inputs; an input from a source/drain of the Pch transistor and an input from a source/drain of the Nch transistor. Also, a transfer gate 210B is formed to have separate inputs; an input from a source/drain of the Pch transistor and an input from a source/drain of the Nch transistor.

More specifically, the universal logic module of the present embodiment has a first node T10, a second node T20, a second A-node T20A, a second B-node T20B, a third node T30, a fourth node T40, a fifth node T50, a sixth node T60, a sixth A-node T60A, and a sixth B-node T60B. With regard to an inverter 100B, an input is connected to the first node T10, and an output is connected to the second node T20. With regard to an inverter 110B, an input is connected to the third node T30, and an output is connected to the sixth node T60. An input of a third inverter 120A is connected to the fourth node T40.

With regard to the transfer gate 200B, the source/drain (input) of the Pch transistor is connected to the second A-node T20A. The source/drain (input) of the Nch transistor is connected to the second B-node T20B. The first control input terminal is connected to the fourth node T40, and the second control input is connected to the output of the third inverter 120A. With regard to the transfer gate 210B, the source/drain (input) of the Pch transistor is connected to the sixth A-node T60A. The source/drain (input) of the Nch transistor is connected to the sixth B-node T60B. The first control input terminal is connected to the output of the third inverter 120A, and the second control input terminal is connected to the fourth node T40.

The fifth node T50 is connected to the output of the transfer gate 200B, and the output of the transfer gate 210B.

In the present embodiment, the inverter 100B is used as the "first inverter", and the transfer gate 200B is used as the "first transfer gate". Thus, the above-mentioned first input terminal is connected to the first node T10. On the other hand, the inverter 110B is used as the "second inverter", and the transfer gate 210B is used as the "second transfer gate".

Figure 10:
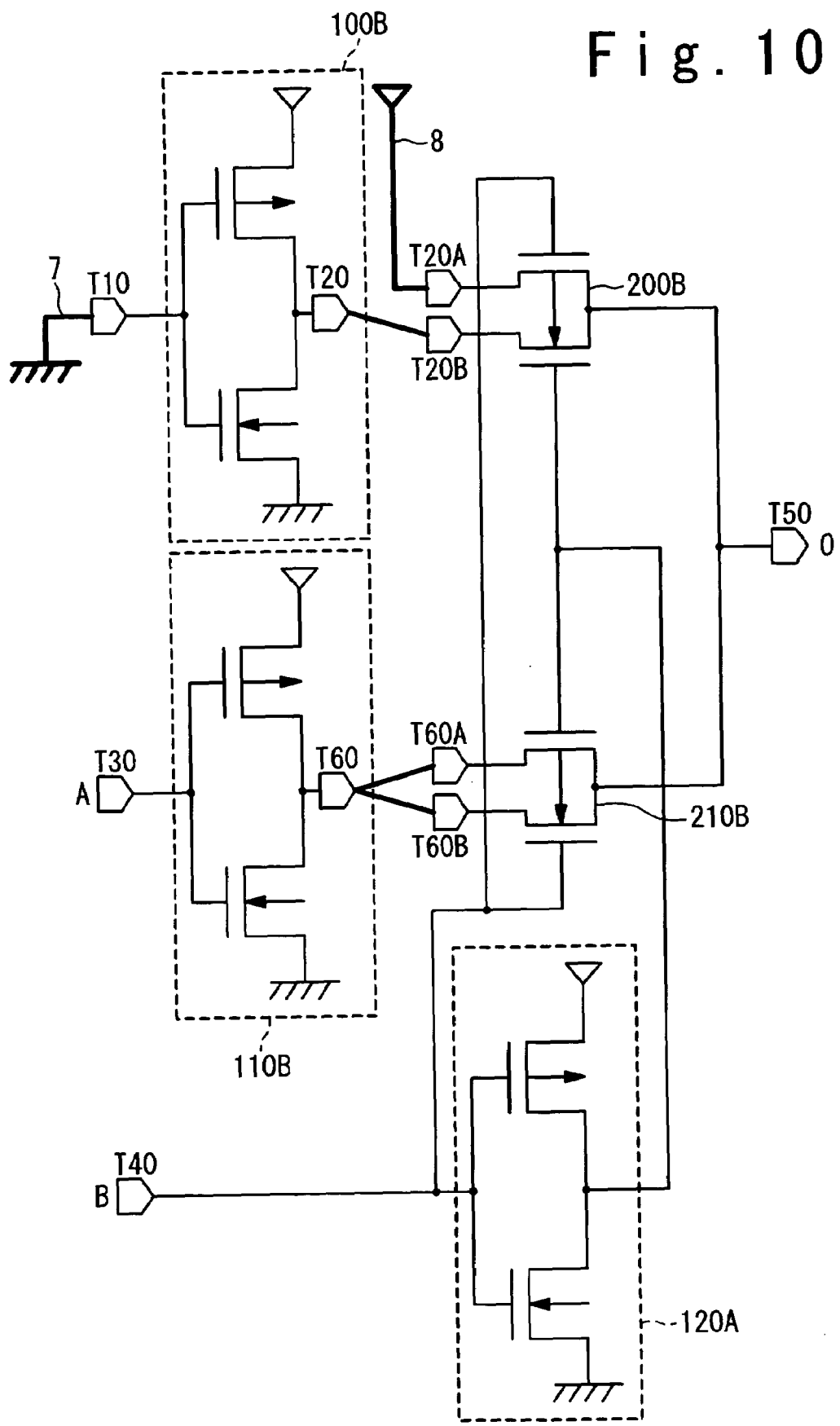
FIG. 10 is a connection diagram at the time of actually operating a NAND circuit achieved by using the universal logic module shown in FIG. 9 according to the third embodiment.

FIG. 10 is a connection diagram at the time of actually operating a "NAND" circuit achieved by using the universal logic module shown in FIG. 9 according to the third embodiment. As shown in FIG. 10, the first node T10 of the universal logic module shown in FIG. 9 is connected to a ground line 7 and is set to an L level (logic "0"). The second A-node T20A is connected to a power supply line 8 and is set to an H level (logic "1"). The second node T20 is connected to the second B-node T20B. The sixth node T60 is connected to the sixth A-node T60A and the sixth B-node T60B. Then, the third node T30 and the fourth node T40 are used as input terminals (A, B), and the fifth node T50 is used as an output terminal (O). In other words, the first logic signal (A) and the second logic signal (B) are respectively inputted into the third node T30 and the fourth node T40. The fifth node T50 outputs an output signal. As a result, a two-inputs NAND circuit is achieved. It should be noted that the second node T20 is not necessarily connected with the second B-node T20B.

According to the NAND circuit shown in FIG. 10, it is possible to reduce the charging time of a circuit driven by the universal logic module according to the present embodiment, as in the second embodiment. It is therefore possible to increase the switching speed and the operation speed.

Moreover, the source/drain (input) of the Pch transistor in the first transfer gate 200B is separated from the source/drain (input) of the Nch transistor in the first transfer gate 200B. Therefore, even when the second A-node T20A is clamped to the power supply, the power supply potential is not directly applied to the Nch transistor of the first transfer gate 200B. Thus, the diffusion layer damage of the Nch transistor of the first transfer gate 200B caused by the electrostatic destruction can be prevented, and the leak current can be reduced. It is therefore possible to improve the reliability of the universal logic module (semiconductor device) as a whole. At this time, from a viewpoint of the prevention of the electrostatic destruction as described above, the source diffusion layer of the first inverter 100B is arranged away from the source diffusion layer of the first transfer gate 200B by a distance.

Furthermore, according to the present embodiment, the second node T20, the second A-node T20A and the second B-node T20B are provided between the first inverter 100B and the first transfer gate 200B. Therefore, the connection between the first inverter 100B and the first transfer gate 200B can be arbitrarily switched. Also, the sixth node T60, the sixth A-node T60A and the sixth B-node T60B are provided between the second inverter 110B and the second transfer gate 210B. Therefore, the connection between the second inverter 100B and the second transfer gate 210B can be arbitrarily switched.

Fourth Embodiment

Figure 11A:
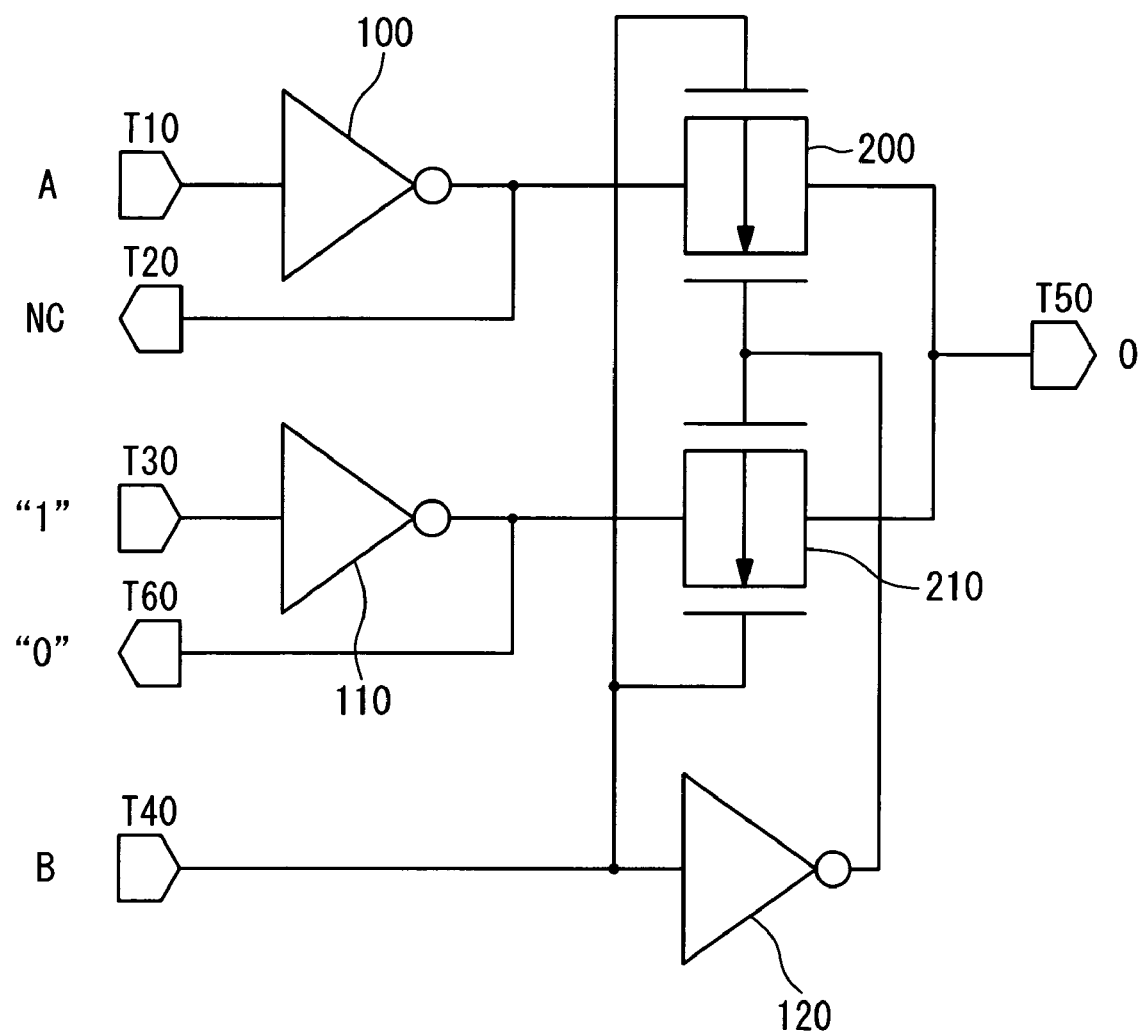
FIG. 11A is a circuit diagram showing a configuration of a NOR circuit achieved by using the universal logic module shown in FIG. 5 according to the fourth embodiment of the present invention.

According to a fourth embodiment of the present invention, a "NOR" circuit is provided by using the universal logic module. FIG. 11A is a circuit diagram showing a configuration of the NOR circuit achieved by using the universal logic module shown in FIG. 5 according to the present embodiment.

In the present embodiment, the inverter 110 is used as the "first inverter", and the transfer gate 210 is used as the "first transfer gate". Thus, the above-mentioned first input terminal is connected to the third node T30, and the input of the first transfer gate 210 is connected to the sixth node T60. On the other hand, the inverter 100 is used as the "second inverter", and the transfer gate 200 is used as the "second transfer gate".

As shown in FIG. 11A, the third node T30 of the universal logic module shown in FIG. 5 is connected to an H level (logic "1"), and the sixth node T60 is connected to an L level (logic "0"). The second node T20 is not connected (denoted by NC). The first node T10 and the fourth node T40 are used as input terminals (A, B). In other words, the first logic signal (A) is inputted to the first node T10, and the second logic signal (B) is inputted to the fourth node T40. The fifth node T50 is used as an output terminal (O). As a result, a two-inputs NOR circuit is realized.

According to the NOR circuit shown in FIG. 11A, the input of the first transfer gate 210 is connected not only to the third node T30 through the first inverter 110 inputting the logic "1" but also to the sixth node T60 to which the logic "0" is inputted. That is, the input of the first transfer gate 210 is directly connected with the ground. As a result, it is possible to improve (enhance) the output driving capability. Thus, the discharging time of a circuit driven by the universal logic module according to the present embodiment can be reduced. It is therefore possible to increase the switching speed and the operation speed.

Figure 1:
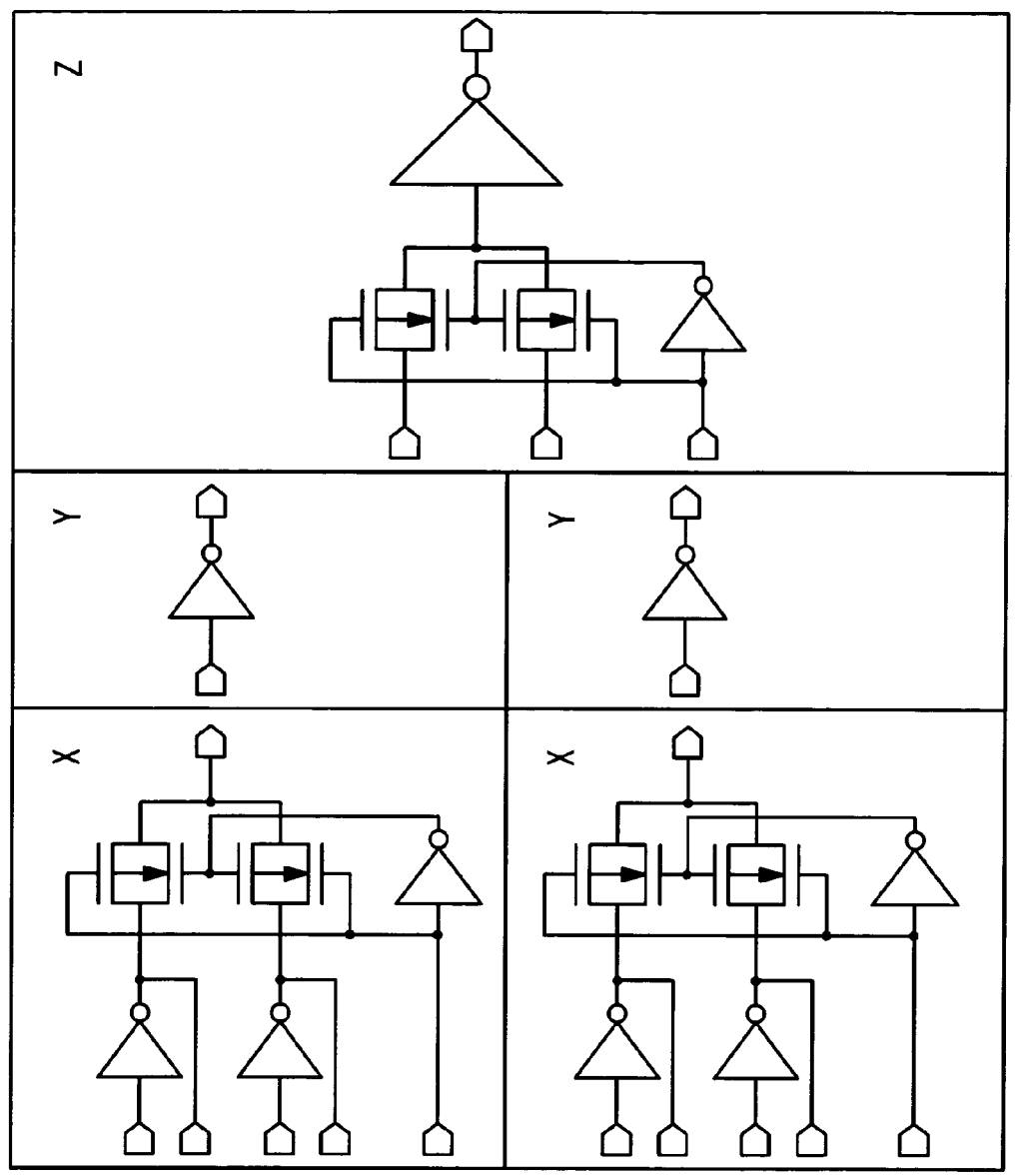
FIG. 1 shows a configuration of a cell using a universal logic cell according to a conventional technique.
Figure 3A:
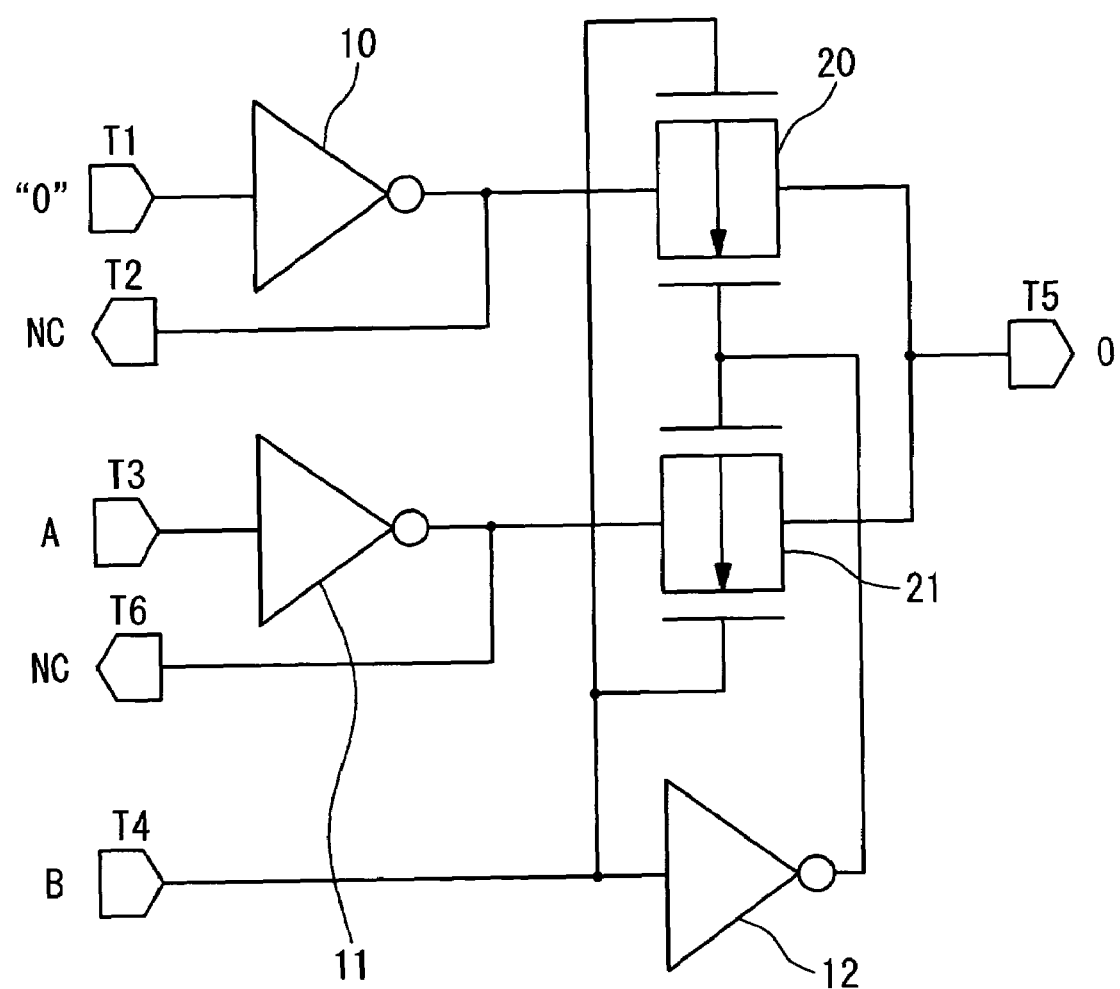
FIG. 3A is a circuit diagram showing a configuration of a NAND circuit provided by using the universal logic module shown in FIG. 2.
Figure 3B:
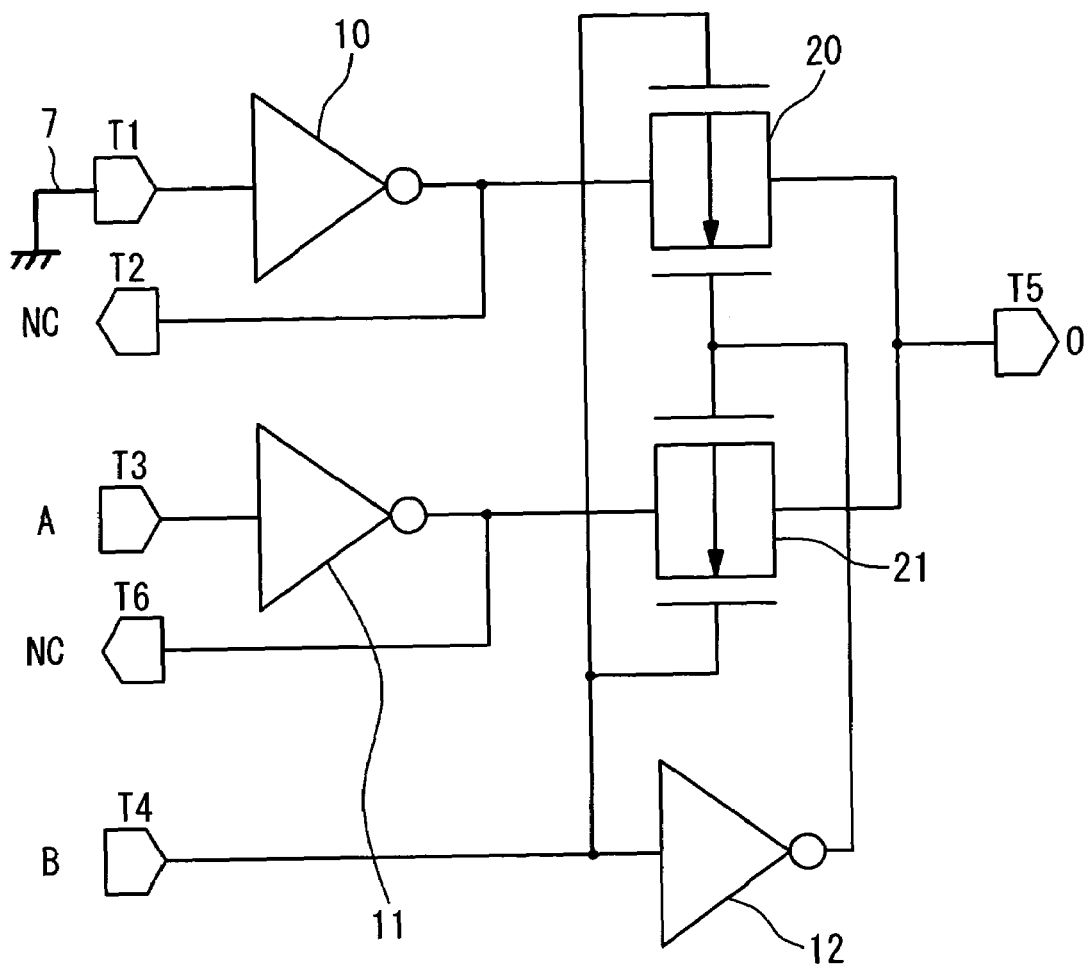
FIG. 3B is a connection diagram at the time of actually operating the NAND circuit shown in FIG. 3A.
Figure 3C:
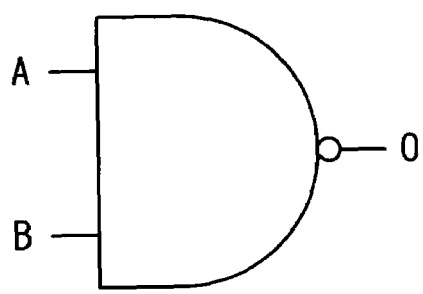
FIG. 3C shows a symbol describing the NAND circuit.
Figure 4A:
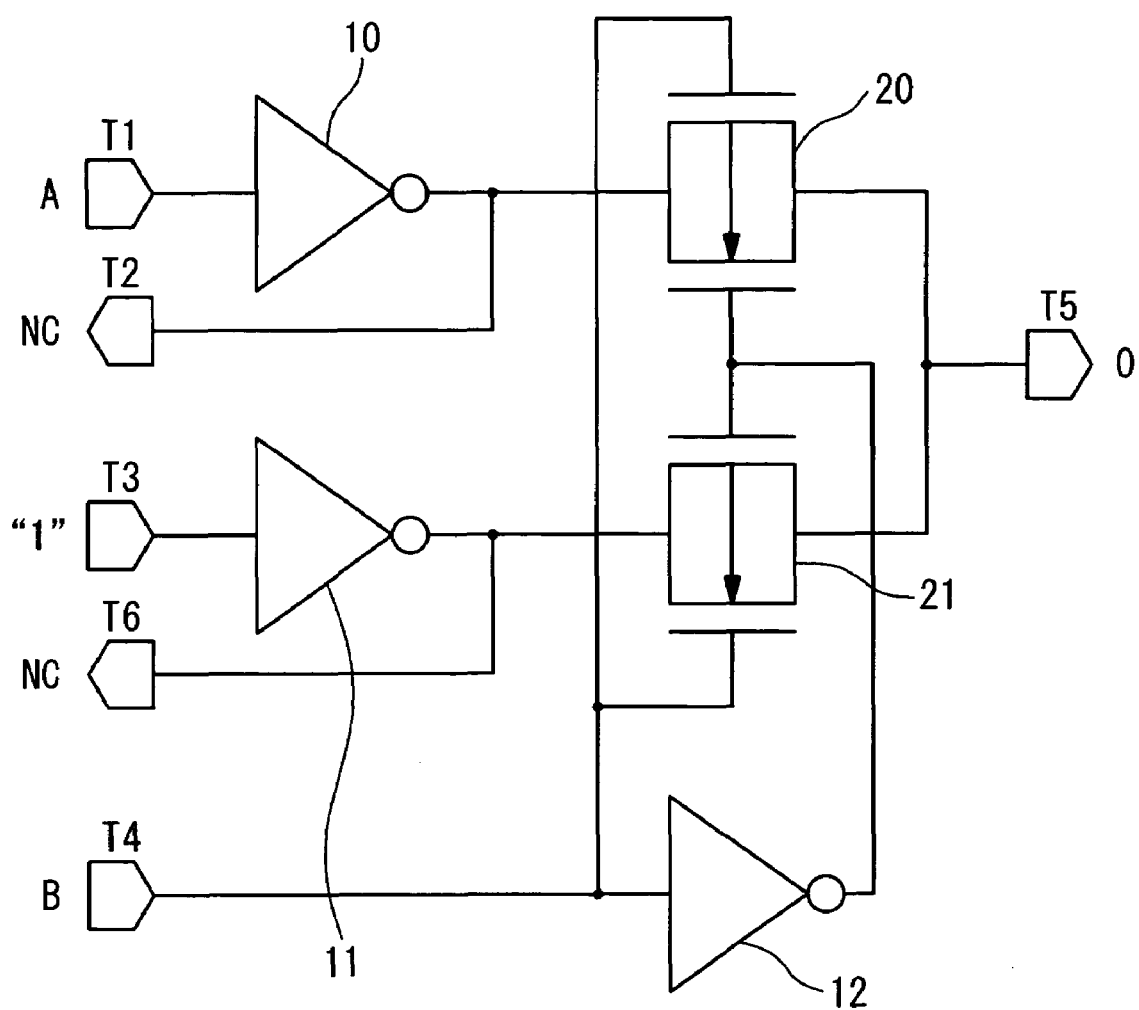
FIG. 4A is a circuit diagram showing a configuration of a NOR circuit provided by using the universal logic module shown in FIG. 2.
Figure 4B:
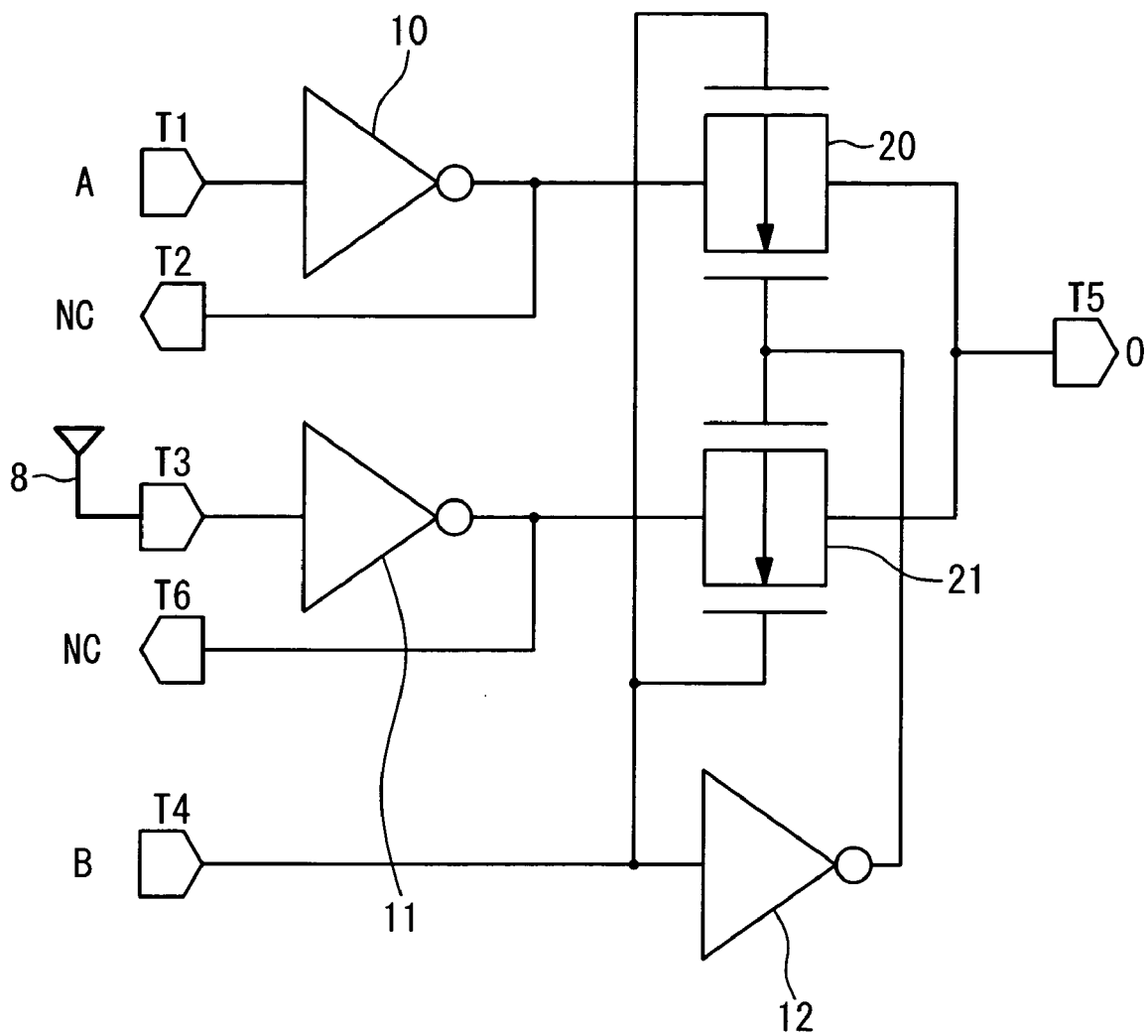
FIG. 4B is a connection diagram at the time of actually operating the NOR circuit shown in FIG. 4A.
Figure 4C:
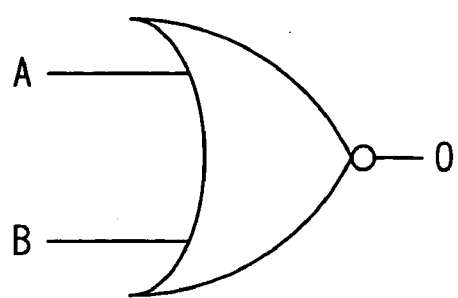
FIG. 4C shows a symbol describing the NOR circuit.
Figure 11B:
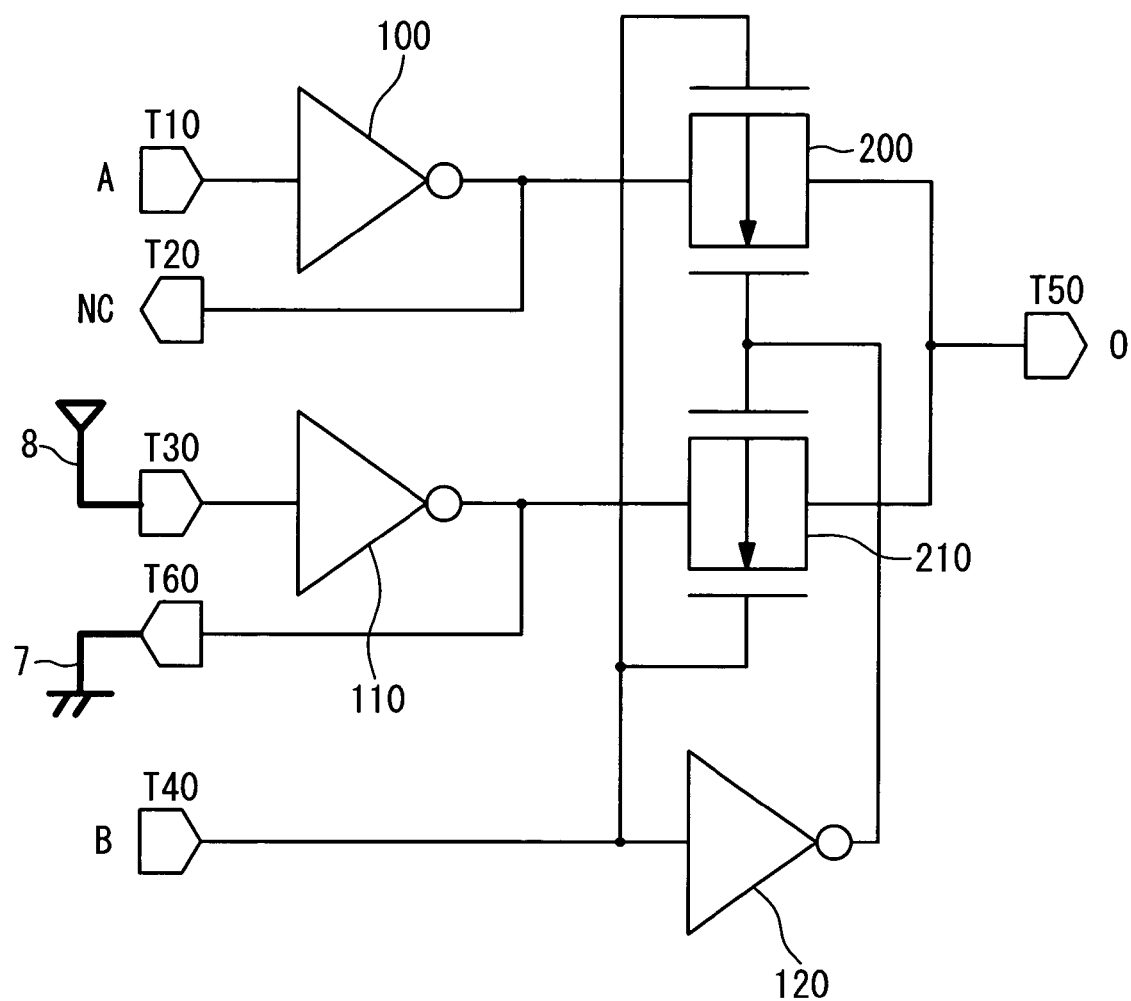
FIG. 11B is a connection diagram at the time of actually operating the NOR circuit shown in FIG. 11A.
Figure 11C:
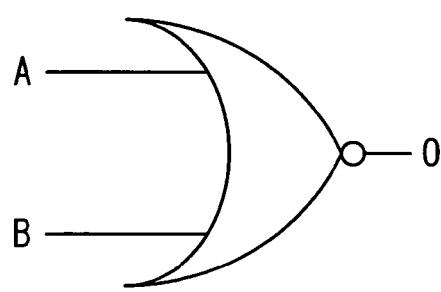
FIG. 11C shows a symbol describing the NOR circuit.

FIG. 11B is a connection diagram at the time of actually operating the NOR circuit shown in FIG. 11A. As shown in FIG. 11B, the third node T30 is connected to a power supply line 8 such that the third node T30 is set to the H level. Also, the sixth node T60 is connected to a ground line 7 such that the sixth node T60 is set to the L level. It should be noted that the circuits shown in FIGS. 11A and 11B are described as a symbol of a "NOR" type (CMOS) shown in FIG. 1C.

Fifth Embodiment

In a fifth embodiment of the present invention, a "NOR" circuit is also provided by using a universal logic module.

Figure 12:
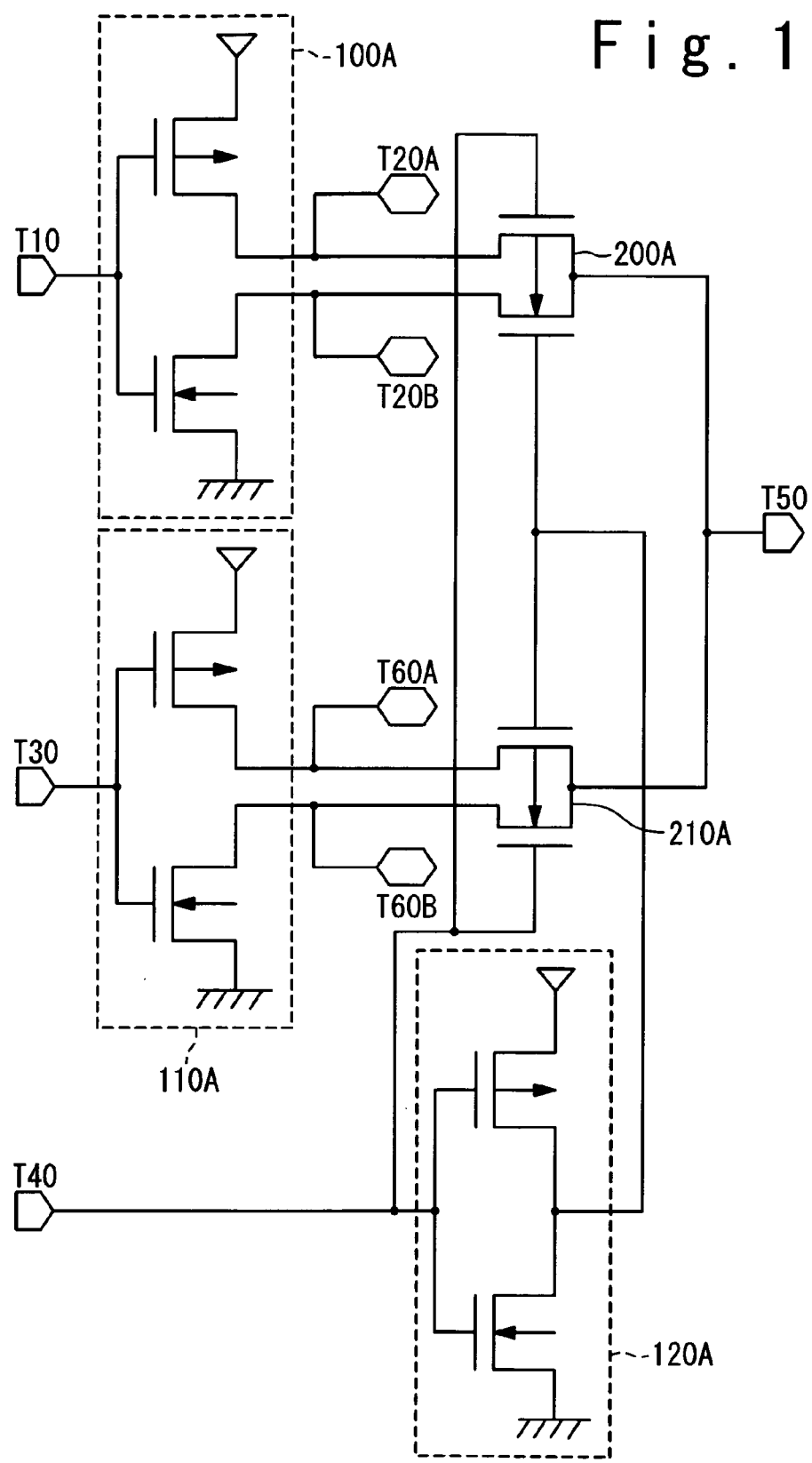
FIG. 12 is a circuit diagram showing a configuration of a universal logic module according to a fifth embodiment of the present invention.

FIG. 12 is a circuit diagram showing a configuration of the universal logic module according to the fifth embodiment of the present invention. Though a basic configuration and a basic operation of the universal logic module in the present embodiment are similar to those in the fourth embodiment, the output terminals of the inverters, and the input terminals of the transfer gates are different from those in the fourth embodiment, as described below.

According to the present embodiment, as shown in FIG. 12, an inverter 100A is formed to have separate outputs; an output from a drain of the Nch transistor and an output from a drain of the Pch transistor. Also, an inverter 110A is formed to have separate outputs; an output from a drain electrode of the Nch transistor and an output from a drain electrode of the Pch transistor. A transfer gate 200A is formed to have separate inputs; an input from a source/drain of the Pch transistor and an input from a source/drain of the Nch transistor. Also, a transfer gate 210A is formed to have separate inputs; an input from a source/drain of the Pch transistor and an input from a source/drain of the Nch transistor.

More specifically, the universal logic module of the present embodiment has a first node T10, a second A-node T20A, a second B-node T20B, a third node T30, a fourth node T40, a fifth node T50, a sixth A-node T60A, and a sixth B-node T60B. The inverter 100A includes a second Pch transistor and a second Nch transistor. A source, a gate and a drain of the second Pch transistor are connected to the power supply, the first node T10 and the second A-node T20A, respectively. A source, a gate and a drain of the first Nch transistor are connected to the ground, the first node T10 and the second B-node T20B, respectively. Also, the inverter 110A includes a first Pch transistor and a first Nch transistor. A source, a gate and a drain of the first Pch transistor are connected to the power supply, the third node T30 and the sixth A-node T60A, respectively. A source, a gate and a drain of the first Nch transistor are connected to the ground, the third node T30 and the sixth B-node T60B, respectively. An input of the third inverter 120A is connected to the fourth node T40.

With regard to the transfer gate 200A, the source/drain (input) of the Pch transistor is connected to the drain of the second Pch transistor of the inverter 100A and the second A-node T20A. The source/drain (input) of the Nch transistor is connected to the drain of the second Nch transistor of the inverter 100A and the second B-node T20B. The first control input terminal is connected to the fourth node T40, and the second control input terminal is connected to the output of the third inverter 120A.

With regard to the transfer gate 210A, the source/drain (input) of the Pch transistor is connected to the drain of the first Pch transistor of the inverter 110A and the sixth A-node T60A. The source/drain (input) of the Nch transistor is connected to the drain of the first Nch transistor of the inverter 110A and the sixth B-node T60B. The first control input terminal is connected to the output of the third inverter 120A, and the second control input terminal is connected to the fourth node T40.

The fifth node T50 is connected to the output of the transfer gate 200A, and the output of the transfer gate 210A.

In the present embodiment, the transfer gate 210A is used as the "first transfer gate", and the transfer gate 200A is used as the "second transfer gate". Also, the inverter 110A and the first transfer gate 210A function as the "first inverter", and the inverter 100A and the second transfer gate 200A function as the "second inverter". The above-mentioned first input terminal is connected to the third node T30.

Figure 13:
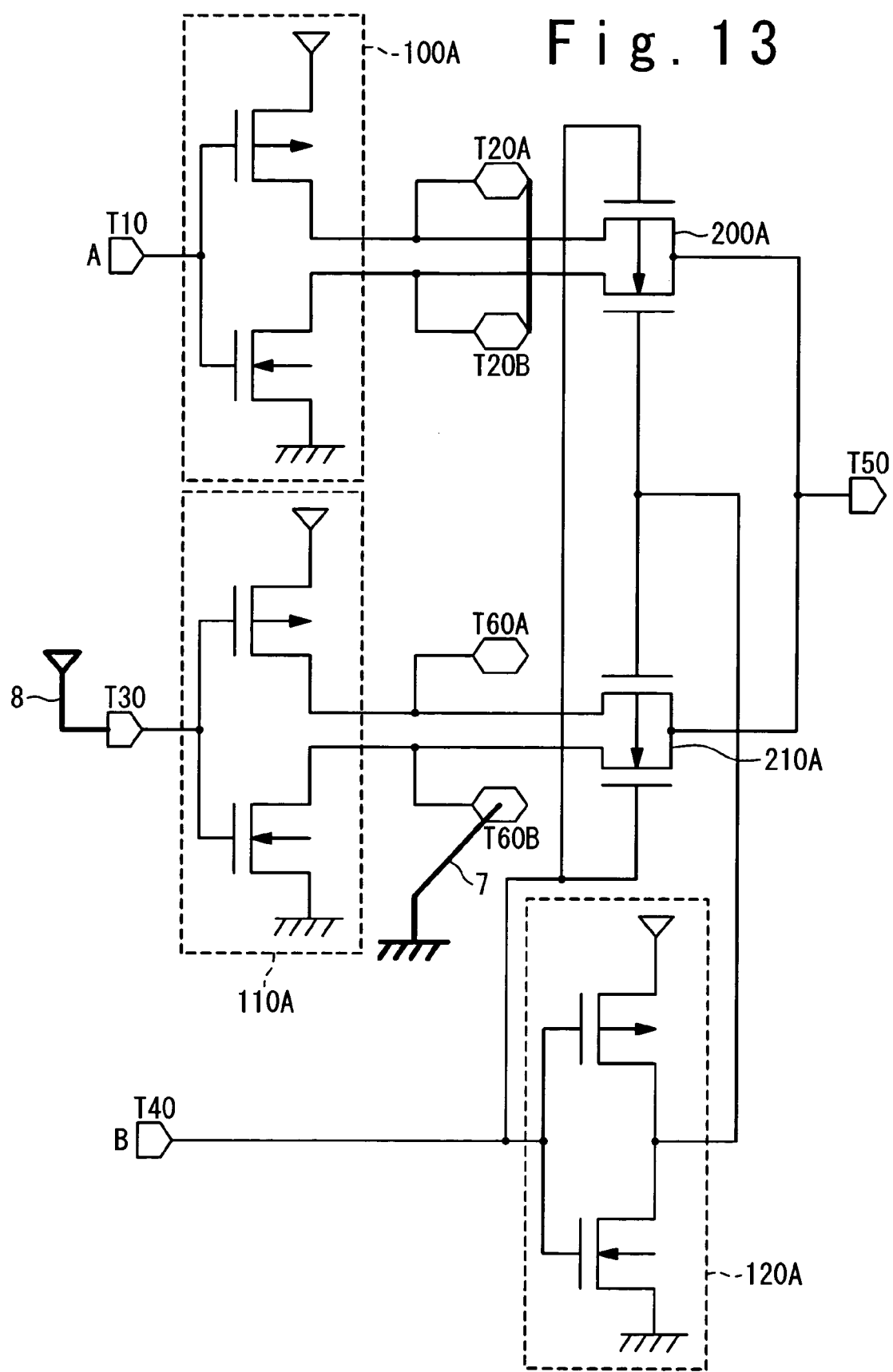
FIG. 13 is a connection diagram at the time of actually operating a NOR circuit achieved by using the universal logic module shown in FIG. 12 according to the fifth embodiment.

FIG. 13 is a connection diagram at the time of actually operating a "NOR" circuit achieved by using the universal logic module shown in FIG. 12 according to the fifth embodiment. As shown in FIG. 13, the third node T30 of the universal logic module shown in FIG. 12 is connected to a power supply line 8 and is set to an H level (logic "1"). The sixth B-node T60B is connected to a ground line 7 and is set to an L level (logic "0"). The sixth A-node T60A is not connected to any other element. The second A-node T20A is short-circuited to the second B-node T20B. Then, the first node T10 and the fourth node T40 are used as input terminals (A, B), and the fifth node T50 is used as an output terminal (O). In other words, the first logic signal (A) and the second logic signal are respectively inputted into the first node T10 and the fourth node T40. The fifth node T50 outputs an output signal. As a result, a two-inputs NOR circuit is achieved. It should be noted that the second A-node T20A is not necessarily connected with the second B-node T20B.

According to the NOR circuit shown in FIG. 13, the sixth B-node T60B is directly connected to the ground, and hence the input of the first transfer gate 210A is directly connected to the ground. That is, the input of the first transfer gate 210A is connected not only to the third node T30 through the first inverter 110A inputting the logic "1" but also to the sixth B-node T60B to which the logic "0" is inputted. As a result, it is possible to improve (enhance) the output driving capability. Thus, the delay time within the universal logic module according to the present embodiment can be reduced. Also, it is possible to reduce the discharging time of a circuit connected to the output terminal (the fifth node T50) and driven by the universal logic module according to the present embodiment. It is therefore possible to increase the switching speed and the operation speed.

Sixth Embodiment

In a sixth embodiment of the present invention, a "NOR" circuit is also provided by using a universal logic module.

Figure 14:
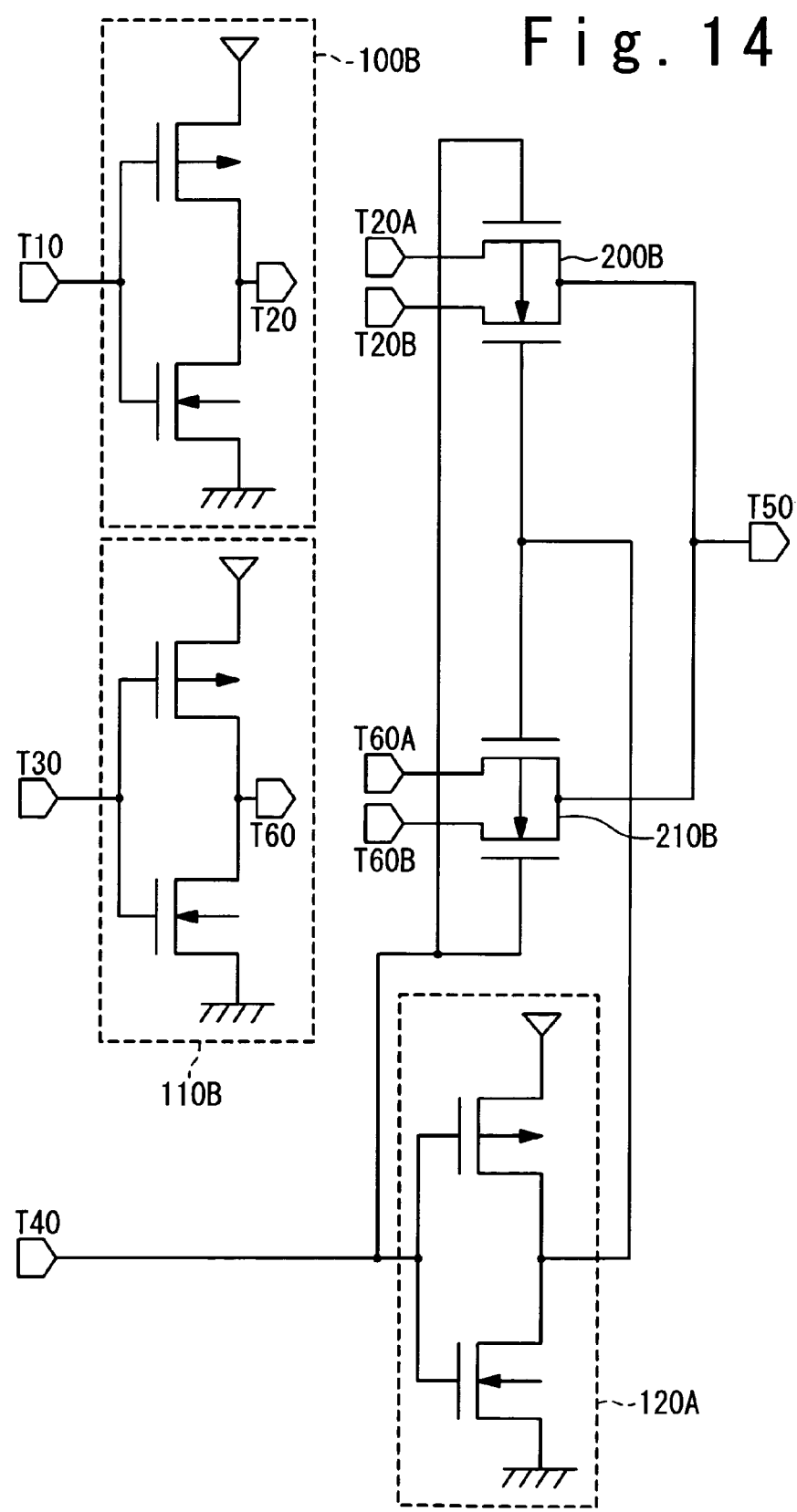
FIG. 14 is a circuit diagram showing a configuration of a universal logic module according to a sixth embodiment of the present invention.

FIG. 14 is a circuit diagram showing a configuration of the universal logic module according to the sixth embodiment of the present invention. Though a basic configuration and a basic operation of the universal logic module in the present embodiment are similar to those in the fourth embodiment, the input terminals of the transfer gates are different from those in the fourth embodiment, as described below.

According to the present embodiment, as shown in FIG. 14, a transfer gate 200B is formed to have separate inputs; an input from a source/drain of the Pch transistor and an input from a source/drain of the Nch transistor. Also, a transfer gate 210B is formed to have separate inputs; an input from a source/drain of the Pch transistor and an input from a source/drain of the Nch transistor.

More specifically, the universal logic module of the present embodiment has a first node T10, a second node T20, a second A-node T20A, a second B-node T20B, a third node T30, a fourth node T40, a fifth node T50, a sixth node T60, a sixth A-node T60A, and a sixth B-node T60B. With regard to an inverter 100B, an input is connected to the first node T10, and an output is connected to the second node T20. With regard to an inverter 110B, an input is connected to the third node T30, and an output is connected to the sixth node T60. An input of a third inverter 120A is connected to the fourth node T40.

With regard to the transfer gate 200B, the source/drain (input) of the Pch transistor is connected to the second A-node T20A. The source/drain (input) of the Nch transistor is connected to the second B-node T20B. The first control input terminal is connected to the fourth node T40, and the second control input is connected to the output of the third inverter 120A. With regard to the transfer gate 210B, the source/drain (input) of the Pch transistor is connected to the sixth A-node T60A. The source/drain (input) of the Nch transistor is connected to the sixth B-node T60B. The first control input terminal is connected to the output of the third inverter 120A, and the second control input terminal is connected to the fourth node T40.

The fifth node T50 is connected to the output of the transfer gate 200B, and the output of the transfer gate 210B.

In the present embodiment, the inverter 110B is used as the "first inverter", and the transfer gate 210B is used as the "first transfer gate". Thus, the above-mentioned first input terminal is connected to the third node T30. On the other hand, the inverter 100B is used as the "second inverter", and the transfer gate 200B is used as the "second transfer gate".

Figure 15:
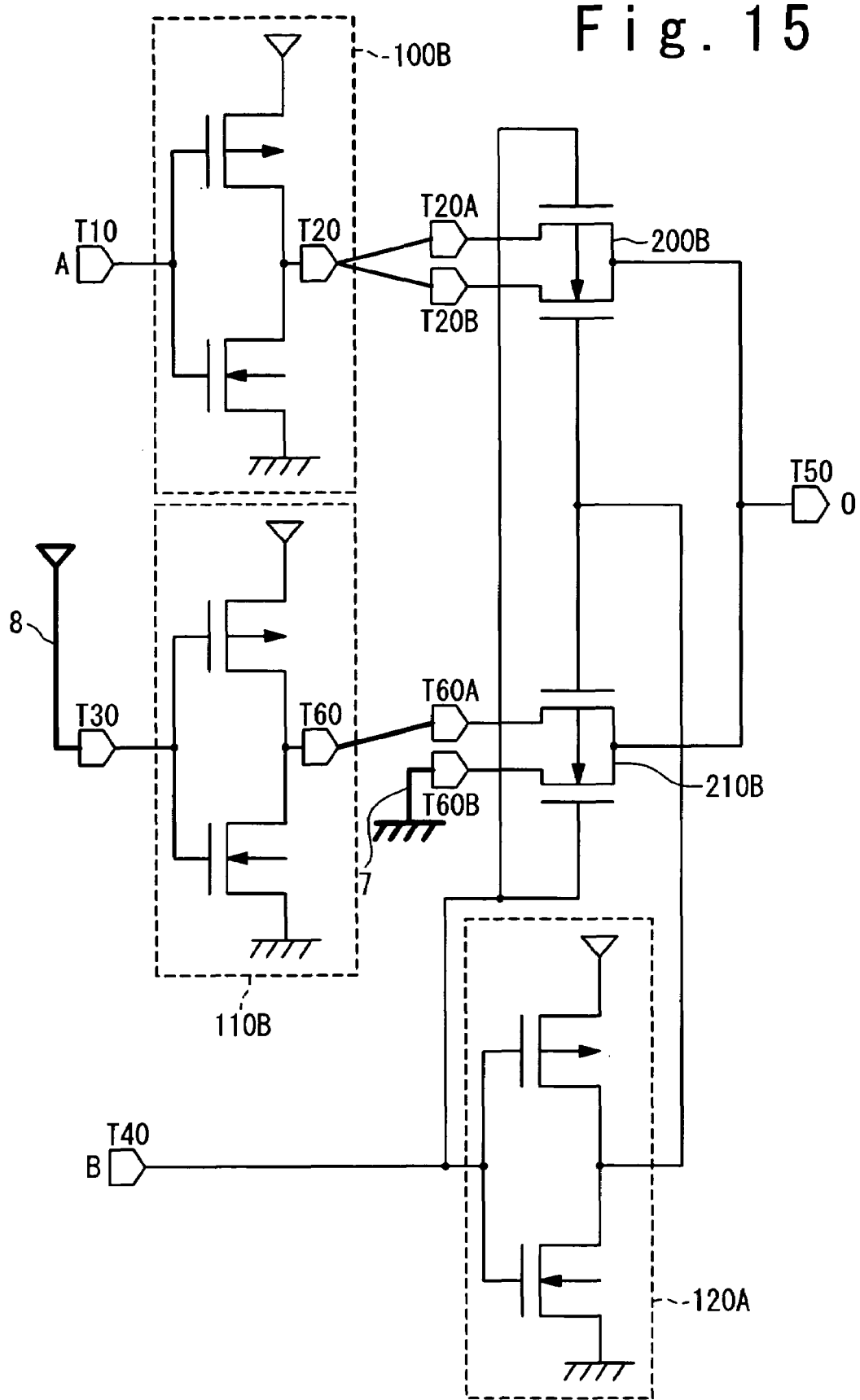
FIG. 15 is a connection diagram at the time of actually operating a NOR circuit achieved by using the universal logic module shown in FIG. 14 according to the sixth embodiment.

FIG. 15 is a connection diagram at the time of actually operating a "NOR" circuit achieved by using the universal logic module shown in FIG. 14 according to the sixth embodiment. As shown in FIG. 15, the third node T30 of the universal logic module shown in FIG. 14 is connected to a power supply line 8 and is set to an H level (logic "1"). The sixth B-node T60B is connected to a ground line 7 and is set to an L level (logic "0"). The sixth node T60 is connected to the sixth A-node T60A. The second node T20 is connected to the second A-node T20A and the second B-node T20B. Then, the first node T10 and the fourth node T40 are used as input terminals (A, B), and the fifth node T50 is used as an output terminal (O). In other words, the first logic signal (A) and the second logic signal (B) are respectively inputted into the first node T10 and the fourth node T40. The fifth node T50 outputs an output signal. As a result, a two-inputs NOR circuit is achieved. It should be noted that the sixth node T60 is not necessarily connected with the sixth A-node T60A.

According to the NOR circuit shown in FIG. 15, it is possible to reduce the discharging time of a circuit driven by the universal logic module according to the present embodiment, as in the fifth embodiment. It is therefore possible to increase the switching speed and the operation speed.

Furthermore, according to the present embodiment, the second node T20, the second A-node T20A and the second B-node T20B are provided between the second inverter 100B and the second transfer gate 200B. Therefore, the connection between the second inverter 100B and the second transfer gate 200B can be arbitrarily switched. Also, the sixth node T60, the sixth A-node T60A and the sixth B-node T60B are provided between the first inverter 110B and the first transfer gate 210B. Therefore, the connection between the first inverter 110B and the first transfer gate 210B can be arbitrarily switched.

It will be obvious to one skilled in the art that the present invention may be practiced in other embodiments that depart from the above-described specific details. The scope of the present invention, therefore, should be determined by the following claims.

What is claimed is:

1. A semiconductor device comprising:
   a power supply line;
   a ground line; and
   a universal logic module,
   wherein said universal logic module includes:
   a first inverter configured to output an inverted input signal to an output terminal through a first transfer gate, said inverted input signal having an inverted level of an input signal provided from a first input terminal; and
   a second inverter configured to output an inverted logic signal to said output terminal through a second transfer gate, said inverted logic signal having an inverted level of a first logic signal,
   wherein said first input terminal is connected to one of said power supply line and said ground line,
   an input of said first transfer gate is directly connected to the other of said power supply line and said ground line,
   said first transfer gate and said second transfer gate are complementarily turned on and off according to a level of a second logic signal, and
   a result of a logical operation between said first logic signal and said second logic signal is outputted from said output terminal.

2. The semiconductor device according to claim 1,
   wherein said universal logic module further includes a third inverter inputting said second logic signal, and
   said first transfer gate and said second transfer gate are complementarily turned on and off according to a level of said second logic signal and an output level of said third inverter.

3. The semiconductor device according to claim 2,
   wherein each of said first transfer gate and said second transfer gate includes:
   a P-channel transistor;
   a N-channel transistor;
   a first control input terminal connected to a gate of said P-channel transistor; and
   a second control input terminal connected to a gate of said N-channel transistor.

4. The semiconductor device according to claim 3,
   wherein said first input terminal is connected to a first node,
   said input of said first transfer gate is connected to a second node,
   said first logic signal is inputted to a third node,
   said second logic signal is inputted to a fourth node,
   said output terminal is connected to a fifth node,
   an input of said second transfer gate is connected to a sixth node,
   said first transfer gate is configured such that said input thereof is connected to an output of said first inverter, said first control input terminal thereof is connected to said fourth node, and said second control input terminal thereof is connected to an output of said third inverter, said second transfer gate is configured such that said input thereof is connected to an output of said second inverter, said first control input terminal thereof is connected to an output of said third inverter, and said second control input terminal thereof is connected to said fourth node, said first node is connected to said ground line, and said second node is connected to said power supply line.

5. The semiconductor device according to claim 4, wherein nodes including said first node, said second node, said third node, said fourth node, said fifth node and said sixth node are formed in a master slice, and interconnections connected to said nodes, said power supply line and said ground line are formed in a customize layer provided on said master slice.

6. The semiconductor device according to claim 3, wherein said first input terminal is connected to a first node, said first logic signal is inputted to a third node, said second logic signal is inputted to a fourth node, said output terminal is connected to a fifth node, said first inverter includes:

a first P-channel transistor whose source, gate and drain are connected to said power supply line, said first node and a second A-node, respectively;

a first N-channel transistor whose source and gate are connected to said ground line and said first node, respectively; and said first transfer gate configured such that a source of said P-channel transistor thereof is connected to said drain of said first P-channel transistor, a source of said N-channel transistor thereof is connected to a drain of said first N-channel transistor, said first control input terminal thereof is connected to said fourth node, and said second control input terminal thereof is connected to an output of said third inverter, said second inverter includes:

a second P-channel transistor whose source and gate are connected to said power supply line and said third node, respectively;

a second N-channel transistor whose source and gate are connected to said ground line and said third node, respectively; and said second transfer gate configured such that a source of said P-channel transistor thereof is connected to a drain of said second P-channel transistor, a source of said N-channel transistor thereof is connected to a drain of said second N-channel transistor, said first control input terminal thereof is connected to an output of said third inverter, and said second control input terminal thereof is connected to said fourth node, said first node is connected to said ground line, and said second A-node is connected to said power supply line.

7. The semiconductor device according to claim 6, wherein nodes including said first node, said second A-node, said third node, said fourth node, and said fifth node are formed in a master slice, and interconnections connected to said nodes, said power supply line and said ground line are formed in a customize layer provided on said master slice.

8. The semiconductor device according to claim 3, wherein said first input terminal is connected to a first node, an output of said first inverter is connected to a second node, said first logic signal is inputted to a third node, said second logic signal is inputted to a fourth node, said output terminal is connected to a fifth node, an output of said second inverter is connected to a sixth node, said first transfer gate is configured such that a source of said P-channel transistor thereof is connected to a second A-node, a source of said N-channel transistor thereof is connected to a second B-node, said first control input terminal thereof is connected to said fourth node, and said second control input terminal thereof is connected to an output of said third inverter, said second transfer gate is configured such that a source of said P-channel transistor thereof is connected to a sixth A-node, a source of said N-channel transistor thereof is connected to a sixth B-node, said first control input terminal thereof is connected to an output of said third inverter, and said second control input terminal thereof is connected to said fourth node, said sixth A-node and said sixth B-node are connected to said sixth node, said second B-node is connected to said second node, said first node is connected to said ground line, and said second A-node is connected to said power supply line.

9. The semiconductor device according to claim 8, wherein nodes including said first node, said second node, said second A-node, said second B-node, said third node, said fourth node, said fifth node, said sixth node, said sixth A-node and said sixth B-node are formed in a master slice, and interconnections connected to said nodes, said power supply line and said ground line are formed in a customize layer provided on said master slice.

10. The semiconductor device according to claim 3, wherein said first input terminal is connected to a third node, said input of said first transfer gate is connected to a sixth node, said first logic signal is inputted to a first node, said second logic signal is inputted to a fourth node, said output terminal is connected to a fifth node, an input of said second transfer gate is connected to a second node, said first transfer gate is configured such that said input thereof is connected to an output of said first inverter, said first control input terminal thereof is connected to an output of said third inverter, and said second control input terminal thereof is connected to said fourth node, said second transfer gate is configured such that said input thereof is connected to an output of said second inverter, said first control input terminal thereof is connected to said fourth node, and said second control input terminal thereof is connected to an output of said third inverter, said third node is connected to said power supply line, and said sixth node is connected to said ground line.

11. The semiconductor device according to claim 10, wherein nodes including said first node, said second node, said third node, said fourth node, said fifth node and said sixth node are formed in a master slice, and interconnections connected to said nodes, said power supply line and said ground line are formed in a customize layer provided on said master slice.

12. The semiconductor device according to claim 3,
wherein said first input terminal is connected to a third node,
said first logic signal is inputted to a first node,
said second logic signal is inputted to a fourth node,
said output terminal is connected to a fifth node,
said first inverter includes:
a first P-channel transistor whose source and gate are connected to said power supply line and said third node, respectively;
a first N-channel transistor whose source, gate and drain are connected to said ground line, said third node and a sixth B-node, respectively; and
said first transfer gate configured such that a source of said P-channel transistor thereof is connected to a drain of said first P-channel transistor, a source of said N-channel transistor thereof is connected to said drain of said first N-channel transistor, said first control input terminal thereof is connected to an output of said third inverter, and said second control input terminal thereof is connected to said fourth node,
said second inverter includes:
a second P-channel transistor whose source and gate are connected to said power supply line and said first node, respectively;
a second N-channel transistor whose source and gate are connected to said ground line and said first node, respectively; and
said second transfer gate configured such that a source of said P-channel transistor thereof is connected to a drain of said second P-channel transistor, a source of said N-channel transistor thereof is connected to a drain of said second N-channel transistor, said first control input terminal thereof is connected to said fourth node, and said second control input terminal thereof is connected to an output of said third inverter,
said third node is connected to said power supply line, and
said sixth B-node is connected to said ground line.

13. The semiconductor device according to claim 12,
wherein nodes including said first node, said third node, said fourth node, said fifth node and said sixth B-node are formed in a master slice, and
interconnections connected to said nodes, said power supply line and said ground line are formed in a customize layer provided on said master slice.

14. The semiconductor device according to claim 3,
wherein said first input terminal is connected to a third node,
an output of said first inverter is connected to a sixth node,
said first logic signal is inputted to a first node,
said second logic signal is inputted to a fourth node,
said output terminal is connected to a fifth node,
an output of said second inverter is connected to a second node,
said first transfer gate is configured such that a source of said P-channel transistor thereof is connected to a sixth A-node, a source of said N-channel transistor thereof is connected to a sixth B-node, said first control input terminal thereof is connected to an output of said third inverter, and said second control input terminal thereof is connected to said fourth node,
said second transfer gate is configured such that a source of said P-channel transistor thereof is connected to a second A-node, a source of said N-channel transistor thereof is connected to a second B-node, said first control input terminal thereof is connected to said fourth node, and said second control input terminal thereof is connected to an output of said third inverter,
said second A-node and said second B-node are connected to said second node, said sixth A-node is connected to said sixth node,
said third node is connected to said power supply line, and
said sixth B-node is connected to said ground line.

15. The semiconductor device according to claim 14,
wherein nodes including said first node, said second node, said second A-node, said second B-node, said third node, said fourth node, said fifth node, said sixth node, said sixth A-node and said sixth B-node are formed in a master slice, and
interconnections connected to said nodes, said power supply line and said ground line are formed in a customize layer provided on said master slice.

* * * * *